US 12,302,513 B2

(12) United States Patent
Noh et al.

(10) Patent No.: US 12,302,513 B2
(45) Date of Patent: May 13, 2025

(54) ACCESSORY DEVICE AND ELECTRONIC DEVICE INCLUDING THE SAME

(71) Applicant: SAMSUNG ELECTRONICS CO., LTD., Suwon-si (KR)

(72) Inventors: Daeyoung Noh, Suwon-si (KR); Hankon Kim, Suwon-si (KR); Dongil Son, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 187 days.

(21) Appl. No.: 17/966,426

(22) Filed: Oct. 14, 2022

(65) Prior Publication Data

US 2023/0144645 A1 May 11, 2023

Related U.S. Application Data

(63) Continuation of application No. PCT/KR2022/012991, filed on Aug. 31, 2022.

(30) Foreign Application Priority Data

Nov. 9, 2021 (KR) .................... 10-2021-0152914
Nov. 19, 2021 (KR) .................... 10-2021-0160078

(51) Int. Cl.
*H05K 5/02* (2006.01)
*H05K 5/00* (2006.01)
*H04N 23/53* (2023.01)

(52) U.S. Cl.
CPC ......... *H05K 5/0217* (2013.01); *H05K 5/0086* (2013.01); *H05K 5/0247* (2013.01); *H04N 23/531* (2023.01)

(58) Field of Classification Search
CPC .................. H05K 5/0017; H05K 5/0217
USPC ................ 361/807, 728, 752, 809, 810
See application file for complete search history.

(56) References Cited

U.S. PATENT DOCUMENTS

| 9,367,094 B2 | 6/2016 | Bibl et al. | |
| 2011/0216064 A1* | 9/2011 | Dahl | H04M 1/0247 345/428 |
| 2012/0280924 A1* | 11/2012 | Kummer | G06F 1/1641 345/173 |

(Continued)

FOREIGN PATENT DOCUMENTS

| CN | 203287832 U | * 11/2013 | ............... G06F 1/16 |
| CN | 103488251 A | * 1/2014 | ........... G06F 1/1615 |

(Continued)

*Primary Examiner* — Hung S. Bui
(74) *Attorney, Agent, or Firm* — CANTOR COLBURN LLP

(57) ABSTRACT

An accessory device detachably attachable to an electronic device comprising a housing which is expandable to define an expanded area of the housing, and a display module which is expandable, together with the housing, to define an expanded area of the display module, and the accessory device may comprise a main body configured to be mounted to the expanded area of the housing, the main body comprising a mounting surface, and a coupling unit which detachably attaches the accessory device to the electronic device, wherein the main body which is attached to the housing which is expanded, may disposes the mounting surface to support the expanded area of the housing together with the expanded area of the display module.

20 Claims, 23 Drawing Sheets

(56) References Cited

U.S. PATENT DOCUMENTS

| | | | | |
|---|---|---|---|---|
| 2013/0335325 | A1* | 12/2013 | Lee | H04B 7/24 |
| | | | | 345/161 |
| 2016/0342373 | A1* | 11/2016 | Huang | H05K 5/0247 |
| 2018/0181164 | A1* | 6/2018 | Chen | G06F 1/1624 |
| 2020/0329572 | A1 | 10/2020 | Wittenberg et al. | |
| 2022/0192336 | A1* | 6/2022 | Kwon | A45C 11/00 |

FOREIGN PATENT DOCUMENTS

| | | | | |
|---|---|---|---|---|
| CN | 204883491 | U | 12/2015 | |
| CN | 109062334 | A | 12/2018 | |
| CN | 210246816 | U * | 4/2020 | G06F 1/16 |
| CN | 111756900 | A | 10/2020 | |
| KR | 1020120007334 | A | 1/2012 | |
| KR | 101515039 | B1 | 4/2015 | |
| KR | 1020190101605 | A | 9/2019 | |
| KR | 1020200060014 | A | 5/2020 | |
| KR | 1020200142707 | A | 12/2020 | |

* cited by examiner

ACCESSORY DEVICE AND ELECTRONIC DEVICE INCLUDING THE SAME

CROSS-REFERENCE TO RELATED APPLICATIONS

This application is a continuation application of International Application No. PCT/KR2022/012991 designating the United States, filed on Aug. 31, 2022, in the Korean Intellectual Property Receiving Office and claiming priority to Korean Patent Application No. 10-2021-0152914, filed on Nov. 9, 2021, and Korean Patent Application No. 10-2021-0160078, filed on Nov. 19, 2021, in the Korean Intellectual Property Office, the disclosures of which are incorporated by reference herein in their entireties.

BACKGROUND

1. Field

The disclosure relates to an accessory device and an electronic device including the same.

2. Description of Related Art

An electronic device has been made slimmer and developed in various ways to strengthen a design element and simultaneously differentiate a functional element. The shape of an electronic device has been made transformable into various shapes, from a standardized rectangular shape.

Research has been conducted to implement a transformable structure which is convenient to carry while providing a wide-screen display. For example, by utilizing a flexible display of which a partial region is foldable, there is a foldable device or a rollable device including an expandable screen display area of the flexible display, according to a usage environment. Related to the rollable device, a partial region of the display may be inside a housing of an electronic device, and as the partial region of the display is inserted into or withdrawn from the housing, the screen display area of the display may be respectively retractable or expandable.

SUMMARY

In an electronic device of which a screen display area of a display expands or retracts, a display and a housing which supports an expanded area of the display, may have an unstable support structure compared to other regions of the electronic device. Additionally, a portion of the electronic device for mechanically affecting the expansion or retraction of the display may be inconvenient to use.

In addition, since the electronic device provides high performance and high function in various fields, such as a via battery, a camera and a speaker, but also provides slimness and light weight to improve portability of the electronic device, improved display devices to simultaneously satisfy the high performance and portability are being developed.

The technical goals to be achieved through example embodiments of the present disclosure are not limited to those described above, and other technical goals not mentioned above are clearly understood by one of ordinary skill in the art from the following description.

According to one embodiment, an accessory device detachably attachable to an electronic device comprising a housing which is expandable to define an expanded area of the housing, and a display module which is expandable, together with the housing, to define an expanded area of the display module, and the accessory device may comprise a main body configured to be mounted to the expanded area of the housing, the main body comprising a mounting surface; and a coupling unit which detachably attaches the accessory device to the electronic device, wherein the main body which is attached to the housing which is expanded, may disposes the mounting surface to support the expanded area of the housing together with the expanded area of the display module.

According to another embodiment, an electronic device may comprise a housing comprising a first housing which is moveable relative to a second housing, in an expansion direction away from the second housing to define an expanded area of the first housing and in a retraction direction toward the second housing; a display module connected to the housing, the display module extendable in the expansion direction to define an expanded area of the display module, and retractable in the retraction direction, together with the first housing; and an accessory device detachably attachable to the housing. In one embodiment, the accessory device may comprise a main body configured to be mounted to the expanded area of the housing, the main body comprising a mounting surface which is extended along the expansion direction, and a coupling unit which detachably attaches the main body to the housing. In one embodiment, the main body which is attached to the housing which is expanded, may disposes the mounting surface to support the expanded area of the display module together with the expanded area of the first housing.

According to various embodiments, an accessory device and an electronic device including the same may support and protect an extended area of the electronic device in an expanded state and may improve portability of the electronic device.

In addition, according to various embodiments, the accessory device may include various types of modules configured to supplement or upgrade a function of the electronic device and thus may realize the high performance of the electronic device and may assist the electronic device to be slimmer and lighter.

Moreover, the effects of the electronic device according to various example embodiments are not limited to the effects mentioned above, and other unmentioned effects can be clearly understood from the following description by one of ordinary skill in the art.

BRIEF DESCRIPTION OF THE DRAWINGS

The above and other aspects, features, and advantages of certain embodiments of the present disclosure will be more apparent from the following detailed description, taken in conjunction with the accompanying drawings, in which.

DETAILED DESCRIPTION

Figure 1:
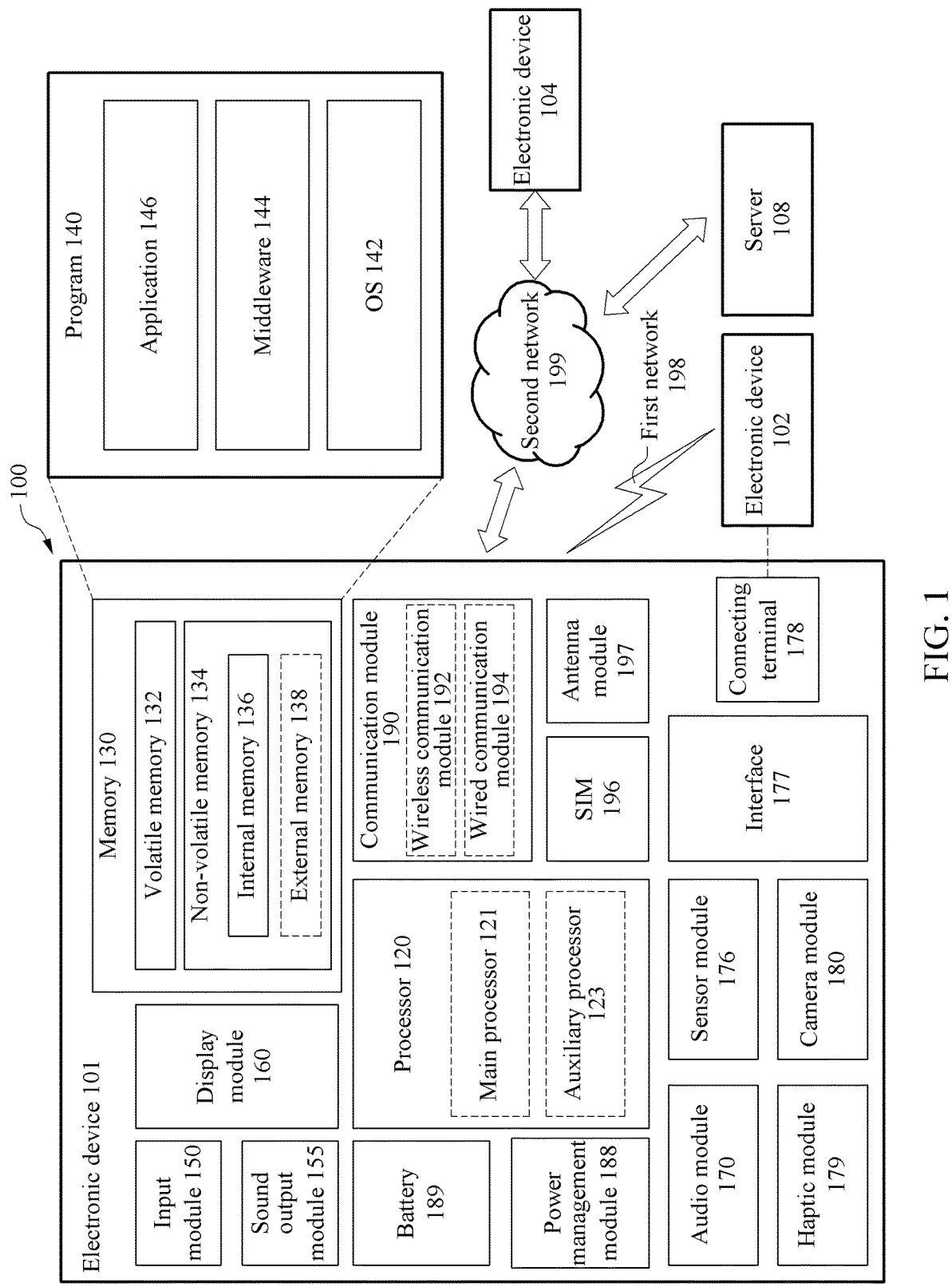
FIG. 1 is a block diagram of an electronic device in a network environment according to one embodiment.

Hereinafter, example embodiments will be described in detail with reference to the accompanying drawings. When describing the example embodiments with reference to the accompanying drawings, like reference numerals refer to like constituent elements and a repeated description related thereto will be omitted. As used herein, a reference number may indicate a singular element or a plurality of the element. For example, a reference number labeling a singular form of an element within the drawing figures may be used to reference a plurality of the singular element within the text of specification.

It should be appreciated that various example embodiments of the present disclosure and the terms used therein are not intended to limit the technical features set forth herein to particular example embodiments and include various changes, equivalents, or replacements for a corresponding example embodiment. In connection with the description of the drawings, like reference numerals may be used for similar or related components.

It is to be understood that a singular form of a noun corresponding to an item may include one or more of the things, unless the relevant context clearly indicates otherwise. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or."

As used herein, "A or B", "at least one of A and B", "at least one of A or B", "A, B or C", "at least one of A, B and C", and "A, B, or C," each of which may include any one of the items listed together in the corresponding one of the phrases, or all possible combinations thereof. As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Terms such as "first", "second", or "first" or "second" may simply be used to distinguish the component from other components in question, and do not limit the components in other aspects (e.g., importance or order).

It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wired), wirelessly, or via a third element. In contrast, if an element (e.g., a first element) is referred to as being "directly coupled with," "directly coupled to," "directly connected with," or "directly connected to" another element (e.g., a second element), it means that the element may be coupled with the other element without a third (intervening) element therebetween.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used in connection with various example embodiments of the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an example embodiment, the module may be implemented in a form of an application-specific integrated circuit (ASIC).

Various example embodiments as set forth herein may be implemented as software (e.g., the program 120) including one or more instructions that are stored in a storage medium (e.g., an internal memory 136 or an external memory 138) that is readable by a machine (e.g., the electronic device). For example, a processor of the machine (e.g., an electronic device) may invoke at least one of the one or more instructions stored in the storage medium and execute it. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Here, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an example embodiment, a method according to various example embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smartphones) directly. If distributed online, at least part of the computer program product may be temporarily generated or at least temporarily stored in the machine-readable storage medium, such as memory of the manufacturer's server, a server of the application store, or a relay server.

According to various example embodiments, each component (e.g., a module or a program) of the above-described components may include a single entity or multiple entities, and some of the multiple entities may be separately disposed in different components. According to various example embodiments, one or more of the above-described components may be omitted, or one or more other components may be added. Alternatively or additionally, a plurality of components (e.g., modules or programs) may be integrated into a single component. In such a case, according to various example embodiments, the integrated component may still perform one or more functions of each of the plurality of components in the same or similar manner as they are performed by a corresponding one of the plurality of components before the integration. According to various example embodiments, operations performed by the module, the program, or another component may be carried out sequentially, in parallel, repeatedly, or heuristically, or one or more of the operations may be executed in a different order or omitted, or one or more other operations may be added.

FIG. 1 is a block diagram illustrating an electronic device 101 in a network environment 100 according to various example embodiments. Referring to FIG. 1, the electronic device 101 in the network environment 100 may communicate with an electronic device 102 via a first network 198 (e.g., a short-range wireless communication network), or communicate with at least one of an electronic device 104 or a server 108 via a second network 199 (e.g., a long-range wireless communication network). According to an example embodiment, the electronic device 101 may communicate with the electronic device 104 via the server 108. According to an example embodiment, the electronic device 101 may include a processor 120, a memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some example embodiments, at least one (e.g., the connecting terminal 178) of the above components may be omitted from the electronic device 101, or one or more other components may be added in the electronic device 101. In some example embodiments, some (e.g., the sensor module 176, the camera module 180, or the antenna module 197) of the components may be integrated as a single component (e.g., the display module 160).

The processor 120 may execute, for example, software (e.g., a program 140) to control at least one other component (e.g., a hardware or software component) of the electronic device 101 connected to the processor 120, and may perform various data processing or computation. According to one embodiment, as at least a portion of data processing or computation, the processor 120 may store a command or data received from another component (e.g., the sensor module 176 or the communication module 190) in a volatile memory 132, process the command or the data stored in the volatile memory 132, and store resulting data in a non-volatile memory 134. According to one embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with the main processor 121. For example, when the electronic device 101 includes the main processor 121 and the auxiliary processor 123, the auxiliary processor 123 may be adapted to consume less power than the main processor 121 or to be specific to a specified function. The auxiliary processor 123 may be implemented separately from the main processor 121 or as a part of the main processor 121.

The auxiliary processor 123 may control at least some of functions or states related to at least one (e.g., the display module 160, the sensor module 176, or the communication module 190) of the components of the electronic device 101, instead of the main processor 121 while the main processor 121 is in an inactive (e.g., sleep) state or along with the main processor 121 while the main processor 121 is in an active state (e.g., executing an application). According to an example embodiment, the auxiliary processor 123 (e.g., an ISP or a CP) may be implemented as a portion of another component (e.g., the camera module 180 or the communication module 190) that is functionally related to the auxiliary processor 123. According to an example embodiment, the auxiliary processor 123 (e.g., an NPU) may include a hardware structure specified for artificial intelligence (AI) model processing. An AI model may be generated by machine learning. Such learning may be performed by, for example, the electronic device 101 in which an artificial intelligence model is executed, or performed via a separate server (e.g., the server 108). Learning algorithms may include, but are not limited to, for example, supervised learning, unsupervised learning, semi-supervised learning, or reinforcement learning. The artificial intelligence model may include a plurality of artificial neural network layers. An artificial neural network may include, for example, a deep neural network (DNN), a convolutional neural network (CNN), a recurrent neural network (RNN), a restricted Boltzmann machine (RBM), a deep belief network (DBN), and a bidirectional recurrent deep neural network (BRDNN), a deep Q-network, or a combination of two or more thereof, but is not limited thereto. The artificial intelligence model may additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134. The non-volatile memory 134 may include an internal memory 136 and an external memory 138.

The program 140 may be stored as software in the memory 130, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output a sound signal to the outside of the electronic device 101. The sound output module 155 may include, for example, a speaker or a receiver. The speaker may be used for general purposes, such as playing multimedia or playing record. The receiver may be used to receive an incoming call. According to an example embodiment, the receiver may be implemented separately from the speaker or as a part of the speaker.

The display module 160 may visually provide information to the outside (e.g., a user) of the electronic device 101. The display module 160 may include, for example, a control circuit for controlling a display, a hologram device, or a projector and control circuitry to control a corresponding one of the display, the hologram device, and the projector. According to an example embodiment, the display device 160 may include a touch sensor adapted to sense a touch, or a pressure sensor adapted to measure an intensity of a force incurred by the touch.

The audio module 170 may convert a sound into an electric signal or vice versa. According to an example embodiment, the audio module 170 may obtain the sound via the input device 150 or output the sound via the sound output device 155 or an external electronic device (e.g., an electronic device 102 such as a speaker or a headphone) directly or wirelessly connected to the electronic device 101.

The sensor module 176 may detect an operational state (e.g., power or temperature) of the electronic device 101 or an environmental state (e.g., a state of a user) external to the electronic device 101, and generate an electric signal or data value corresponding to the detected state. According to an example embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an example embodiment, the interface 177 may include, for example, a high-definition multimedia interface (HDMI), a universal serial bus (USB) interface, a secure digital (SD) card interface, or an audio interface.

The connecting terminal 178 may include a connector via which the electronic device 101 may be physically connected to an external electronic device (e.g., the electronic device 102). According to an example embodiment, the connecting terminal 178 may include, for example, an HDMI connector, a USB connector, an SD card connector, or an audio connector (e.g., a headphone connector).

The haptic module 179 may convert an electric signal into a mechanical stimulus (e.g., a vibration or a movement) or an electrical stimulus which may be recognized by a user via his or her tactile sensation or kinesthetic sensation. According to an example embodiment, the haptic module 179 may include, for example, a motor, a piezoelectric element, or an electric stimulator.

The camera module 180 may capture a still image and moving images. According to an example embodiment, the camera module 180 may include one or more lenses, image sensors, ISPs, or flashes.

The power management module 188 may manage power supplied to the electronic device 101. According to an example embodiment, the power management module 188 may be implemented as, for example, at least a part of a power management integrated circuit (PMIC).

The battery 189 may supply power to at least one component of the electronic device 101. According to an example embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently of the processor 120 (e.g., an AP) and that support a direct (e.g., wired) communication or a wireless communication. According to an example embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module, or a power line communication (PLC) module). A corresponding one of these communication modules may communicate with the external electronic device 104 via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., a LAN or a wide area network (WAN))). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the SIM 196.

The wireless communication module 192 may support a 5G network after a 4G network, and a next-generation communication technology, e.g., a new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., a mmWave band) to achieve, e.g., a high data transmission rate. The wireless communication module 192 may support various technologies for securing performance on a high-frequency band, such as, e.g., beamforming, massive multiple-input and multiple-output (MIMO), full dimensional MIMO (FD-MIMO), an array antenna, analog beam-forming, or a large scale antenna. The wireless communication module 192 may support various requirements specified in the electronic device 101, an external electronic device (e.g., the electronic device 104), or a network system (e.g., the second network 199). According to an example embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an example embodiment, the antenna module 197 may include an antenna including a radiating element including a conductive material or a conductive pattern formed in or on a substrate (e.g., a printed circuit board (PCB)). According to an example embodiment, the antenna module 197 may include a plurality of antennas (e.g., array antennas). In such a case, at least one antenna appropriate for a communication scheme used in a communication network, such as the first network 198 or the second network 199, may be selected by, for example, the communication module 190 from the plurality of antennas. The signal or the power may be transmitted or received between the communication module 190 and the external electronic device via the at least one selected antenna. According to an example embodiment, another component (e.g., a radio frequency integrated circuit (RFIC)) other than the radiating element may be additionally formed as a part of the antenna module 197.

According to various example embodiments, the antenna module 197 may form a mmWave antenna module. According to an example embodiment, the mmWave antenna module may include a PCB, an RFIC disposed on a first surface (e.g., a bottom surface) of the PCB or adjacent to the first surface and capable of supporting a designated a high-frequency band (e.g., the mmWave band), and a plurality of antennas (e.g., array antennas) disposed on a second surface (e.g., a top or a side surface) of the PCB, or adjacent to the second surface and capable of transmitting or receiving signals in the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an example embodiment, commands or data may be transmitted or received between the electronic device 101 and the external electronic device 104 via the server 108 coupled with the second network 199. Each of the external electronic devices 102 and 104 may be a device of the same type as or a different type from the electronic device 101. According to an example embodiment, all or some of operations to be executed by the electronic device 101 may be executed at one or more of the external electronic devices 102, 104, and 108. For example, if the electronic device 101 needs to perform a function or a service automatically, or in response to a request from a user or another device, the electronic device 101, instead of, or in addition to, executing the function or the service, may request one or more external electronic devices to perform at least part of the function or the service. The one or more external electronic devices receiving the request may perform the at least part of the function or the service requested, or an additional function or an additional service related to the request, and may transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another example embodiment, the external electronic device 104 may include an Internet-of-things (IoT) device. The server 108 may be an intelligent server using machine learning and/or a neural network. According to an example embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

Figure 2A:
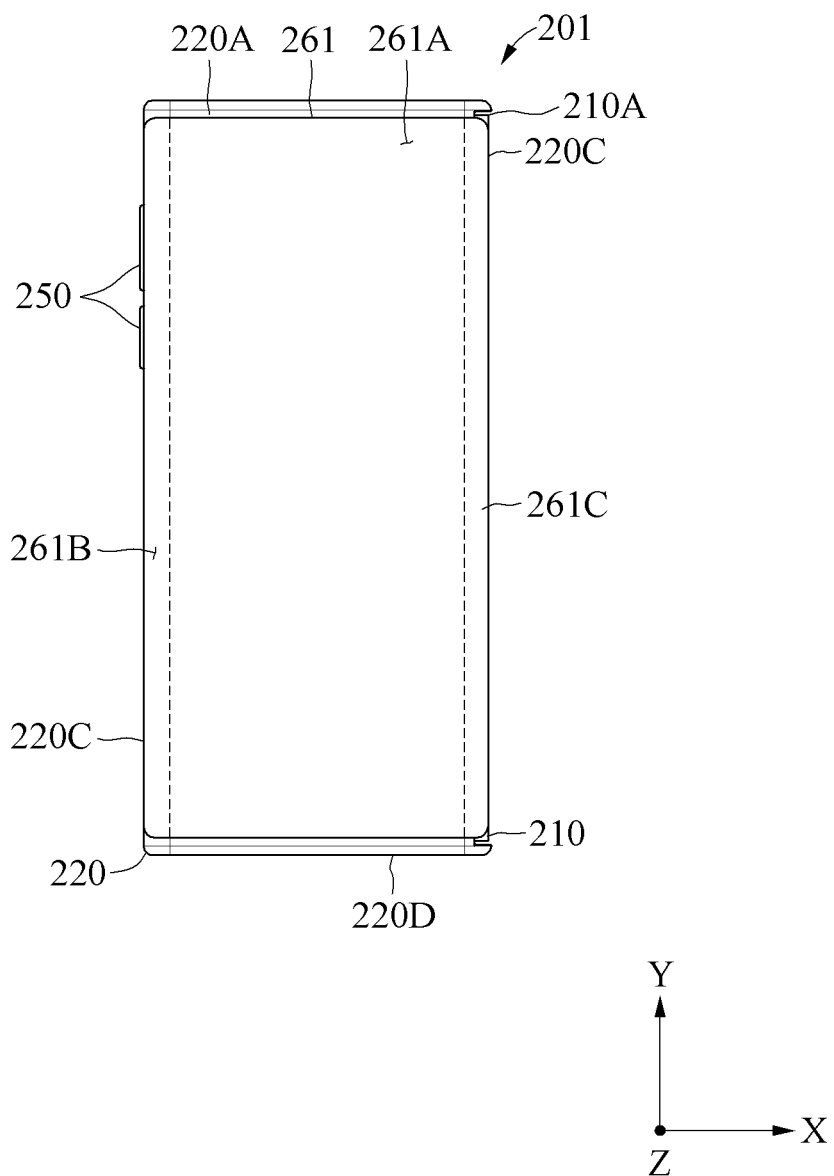
FIG. 2A is a front view of an electronic device according to one embodiment.
Figure 2B:
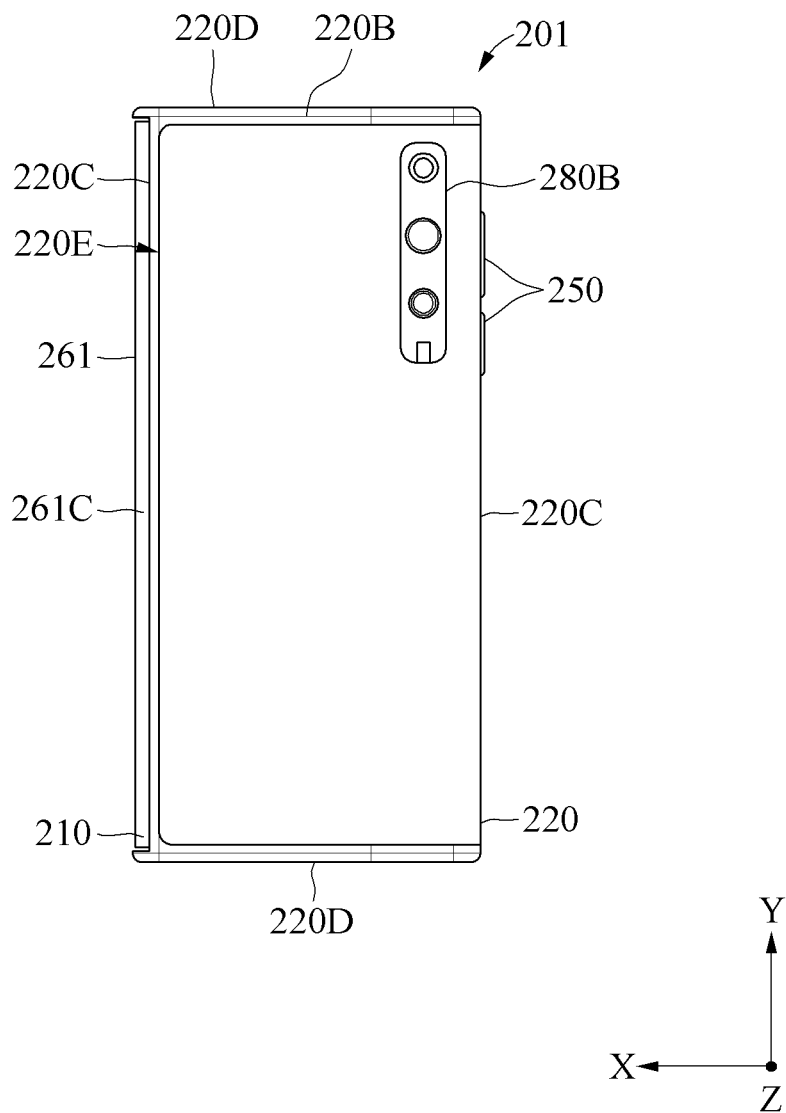
FIG. 2B is a rear view of the electronic device according to one embodiment.
Figure 2C:
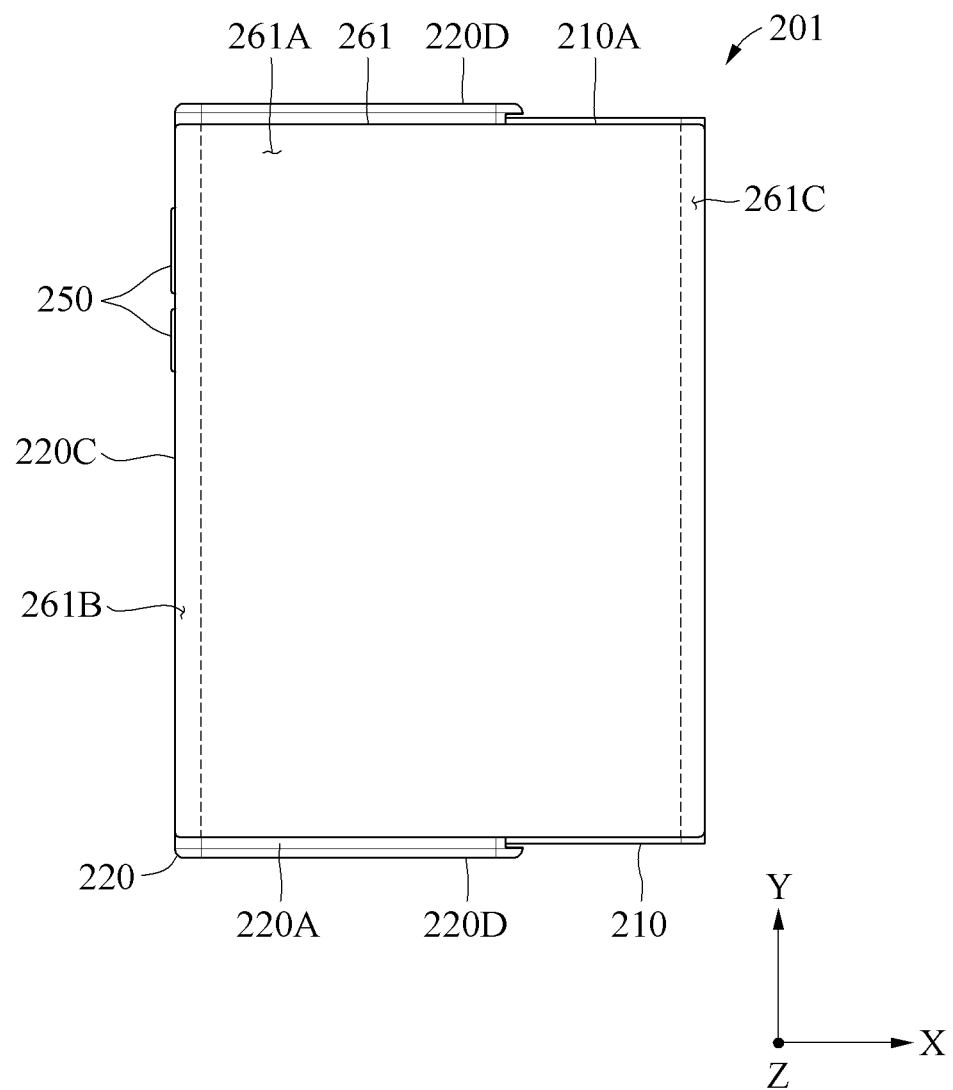
FIG. 2C is a front view of the electronic device according to one embodiment.
Figure 2D:
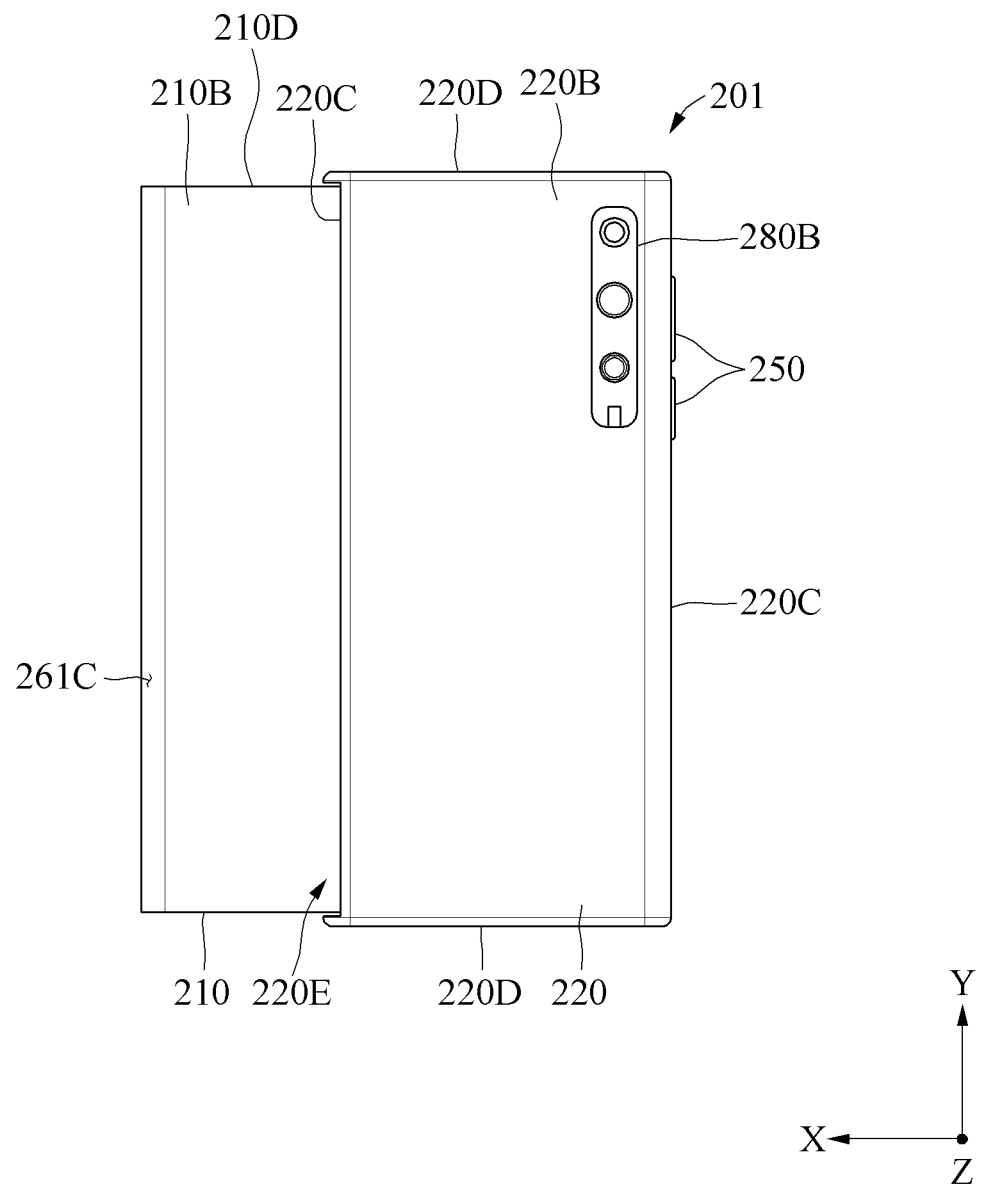
FIG. 2D is a rear view of the electronic device according to one embodiment.
Figure 2E:
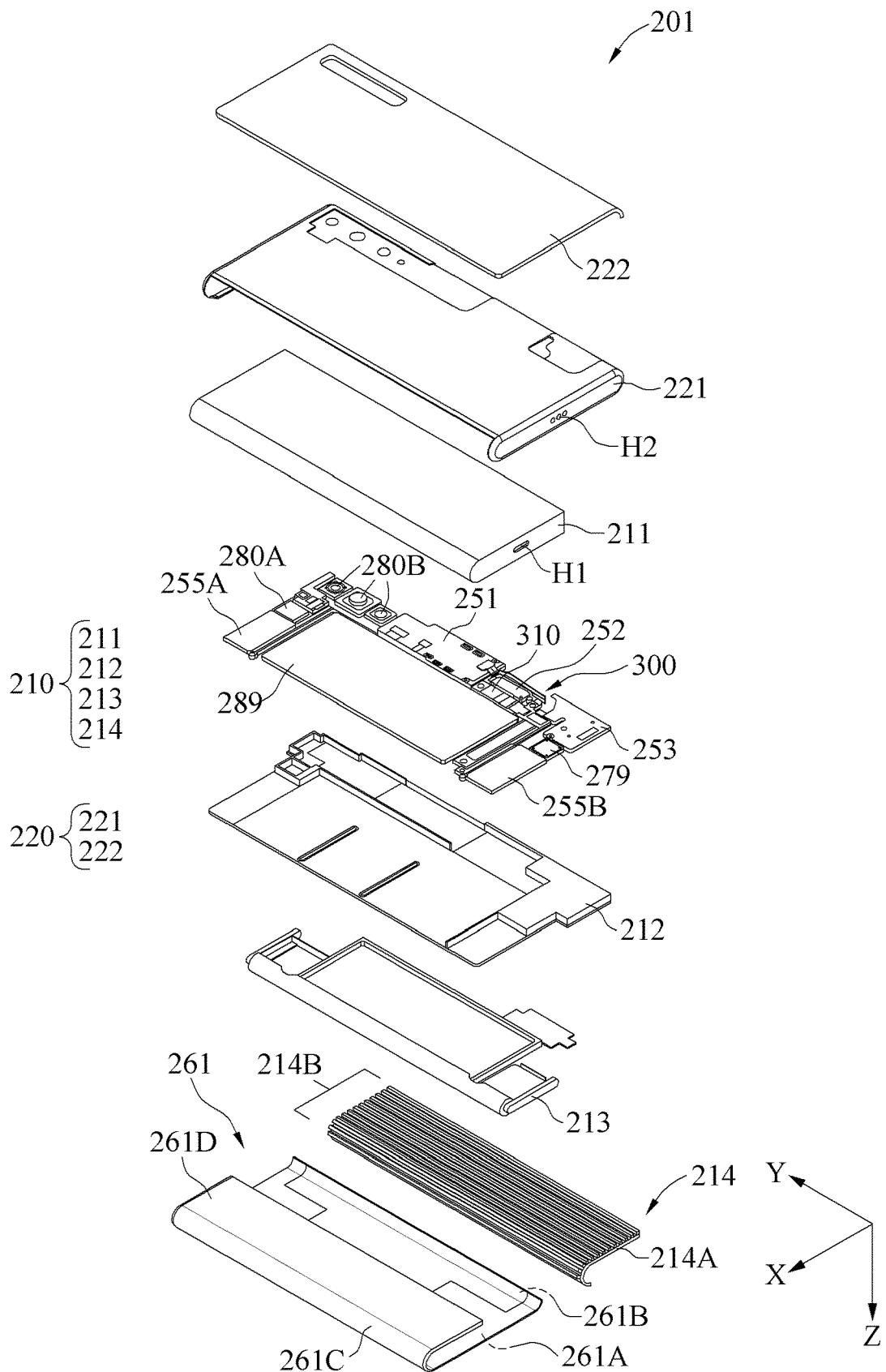
FIG. 2E is an exploded perspective view of the electronic device according to one embodiment.

FIG. 2A is a front view of an electronic device according to one embodiment, FIG. 2B is a rear view of the electronic device according to one embodiment, FIG. 2C is a front view of the electronic device according to one embodiment, FIG. 2D is a rear view of the electronic device according to one embodiment, and FIG. 2E is an exploded perspective view of the electronic device according to one embodiment.

Specifically, FIGS. 2A and 2B are views when the electronic device is in a "retracted state" and FIGS. 2C and 2D are views when the electronic device is in an "expanded state".

Referring to FIGS. 2A to 2E, an electronic device 201 (e.g., the electronic device 101 of FIG. 1) may include a first housing 210 and a second housing 220 configured to form the exterior of the electronic device 201 and accommodate a component. The first housing 210 and the second housing 220 may be movably coupled to each other.

In one embodiment, the first housing 210 may be slidably coupled to the second housing 220. The first housing 210 may be configured to move relative to the second housing 220 in an expansion direction (e.g., the +X direction) or move relative to the second housing 220 in a retraction direction (e.g., the −X direction) which is opposite to the expansion direction. Although it is described that in various embodiments of the present disclosure the first housing 210 moves relative to the second housing 220, the embodiments are not limited thereto and it may also be construed that the second housing 220 slides relative to the first housing 210.

In one embodiment, the first housing 210 may include a first surface 210A (e.g., a first front surface), a second surface 210B (e.g., a first rear surface) opposite to the first surface 210A, a plurality (e.g., two) of first side surfaces (e.g., a first left side surface and a first right side surface) oriented in a direction (e.g., the +/−X direction) and positioned between the first surface 210A and the second surface 210B, and a plurality (e.g., two) of second side surfaces 210D (e.g., a first upper side surface and a first lower side surface) oriented in another direction (e.g., the +/−Y direction) intersecting with the direction (e.g., the +/−X direction) and positioned between the first surface 210A and the second surface 210B. The plurality of side surfaces 210D described above at various positions may be round surfaces. The first housing 210 may include at least one first hole H1 formed in the second side surface 210D (e.g., the first lower side surface) oriented in a direction (e.g., the −Y direction) among the second side surfaces 210D.

In one embodiment, the second housing 220 may include a third surface 220A (e.g., a second front surface), a fourth surface 220B (e.g., a second rear surface) opposite to the third surface 220A, a plurality (e.g., two) of third side surfaces 220C (e.g., a second left side surface and a second right side surface) oriented in a direction (e.g., the +/−X direction) and positioned between the third surface 220A and the fourth surface 220B, and a plurality (e.g., two) of fourth side surfaces 220D (e.g., a second upper side surface and a second lower side surface) oriented in another direction (e.g., the +/−Y direction) intersecting with the direction (e.g., the +/−X direction) and positioned between the third surface 220A and the fourth surface 220B. Among the plurality of third side surfaces 220C, the third side surface 220C oriented in one direction (e.g., the +X direction) may include an open portion 220E that is at least partially open. The plurality of third side surfaces 220C may be round surfaces. The second housing 220 may include at least one second hole H2 formed in the fourth side surface 220D (e.g., the second lower side surface) oriented in a direction (e.g., the −Y direction) among the plurality of fourth side surfaces 220D. The second hole H2 may be aligned, for example, with the first hole H1.

In one embodiment, the electronic device 201 may include a display module 261 (e.g., the display module 160 of FIG. 1) including screen display areas, a first area 261A, a second area 261B, a third area 261C, and a fourth area 261D. The display module 261 may be any of a flexible display, a foldable display, and a rollable display.

In one embodiment, the screen display areas 261A, 261B, 261C, and 261D may include a first area 261A on (or corresponding to) the first surface 210A and the third surface 220A, a second area 261B on the third side surface 220C oriented in a direction (e.g., the −X direction) among the third side surfaces 220C, a third area 261C on the third side surface 220C oriented in the other direction (e.g., the +X direction) among the third side surfaces 220C and at least partially enclosing the open portion 220E, and a fourth area 261D on the second surface 210B and the fourth surface 220B.

The, first area 261A may be a portion of the display module 261 which is furthest from the housing, while the fourth area 261D may be a portion of the display module 261 which is closest to the housing. The second area 261B may connect the first and fourth areas 261A and 261D to each other, while the first area 261A may connect the second and third areas 261B and 261C to each other.

In one embodiment, the second area 261B and the third area 261C of the display module 261 may include flexibly curved round surfaces. The second area 261B may be partially on the first surface 210A and the third surface 220A. The third area 261C may be partially on the first surface 210A and the third surface 220A. The third area 261C may be partially on the second surface 210B and the fourth surface 220B.

In one embodiment, the display module 261 may be configured to partially display an image on or at a display screen. For example, the display module 261 may display the image at a display screen provided through the first area 261A on the first surface 210A and the third surface 220A, while the second area 261B, the third area 261C, and the fourth area 261D may display an image or provide a display screen at different points in time from that of the first area 261A. The first area 261A may define or correspond to a main display screen, while the various other areas may define a secondary display screen at the different points in time. The screen display area of the display module 261 (e.g., a planar area closest to the front of the electronic device 201) may expand or may retract as the first housing 210 moves in the expansion direction and the retraction direction. That is, a display area of the display module 261 may be expandable and retractable together with expansion and retraction of the housing.

In one embodiment, when viewed from a direction (e.g., the −Z direction), the electronic device 201 may change in shape between a first shape (e.g., a retracted state, the shape of FIG. 2A) having the screen display area (e.g., a total planar area of the first area 261A, the second area 261B, and the third area 261C) of a first size in a plan view (e.g., a view of the plane defined by a first direction and a second direction crossing each other, such as the X direction and the Y direction crossing each other), and a second shape (e.g., an expanded state, the shape of FIG. 2B) having the screen display area (e.g., a total planar area of the first area 261A, the second area 261B, and the third area 261C) that is larger than the first size. For example, when the first housing 210 moves relative to the second housing 220 in the expansion direction (e.g., the +X direction) from the first shape, the screen display area of the electronic device 201 viewed from a direction (e.g., the −Z direction) may expand as the size of the first area 261A increases and the size of the fourth area 261D decreases. From the second shape, when the first housing 210 moves relative to the second housing 220 in the retraction direction (e.g., the −X direction) opposite to the expansion direction, the size of the first area 261A may decrease and the size of the fourth area 261D may increase. While the electronic device 201 changes in shape between the first shape and the second shape, the size (e.g., planar area) of the second area 261B and the size of the third area 261C may be substantially constant.

In one embodiment, the electronic device 201 may include a slide device 300 including a drive device 310 configured to move the first housing 210 and the second housing 220 relative to each other. The slide device 300 may be connected to the first housing 210 and the second housing 220 and may slide one of the first housing 210 and the second housing 220 relative to the other housing 210 or 220. As the first housing 210 or the second housing 220 moves, the display may expand or may retract.

In one embodiment, the electronic device 201 may include an input module 250 (e.g., the input module 150 of FIG. 1). The input module 250 may be, for example, formed on the third side surface 220C (e.g., the second left side surface) where the open portion 220E is not formed, among the plurality of third side surfaces 220C.

In one embodiment, the electronic device 201 may include a first sound output module 255A (e.g., the sound output module 155 of FIG. 1) and a second sound output module 255B (e.g., the sound output module 155 of FIG. 1). The first sound output module 255A may be on a first portion (e.g., an upper portion) of the first housing 210, and the second sound output module 255B may be on a second portion (e.g., a lower portion) that is different from the first portion of the first housing 210.

For example, in the first shape (e.g., the retracted state of the electronic device 201 of FIG. 2A), the first sound output module 255A may be configured to function as a transmitter/receiver and the second module 255B may be configured to function as a speaker, whereas, in the second shape (e.g., the expanded state of the electronic device 201 of FIG. 2B), the first sound output module 255A and the second sound output module 255B may be configured to function as a speaker. In the second shape, the first sound output module 255A and the second sound output module 255B may together output stereo sound.

In one embodiment, in the first shape, the second sound output module 255B may be configured to emit sound through the first hole H1 and the second hole H2 substantially aligned with each other, and in the second shape, the second sound output module 255B may be configured to emit sound through the first hole H1. At least one of the first sound output module 255A and the second sound output module 255B may be in the second housing 220. The electronic device 201 may include only one of the first sound output module 255A and the second sound output module 255B, or may further include an additional sound output module in addition to the shown sound output modules.

In one embodiment, the electronic device 201 may include a haptic module 279 (e.g., the haptic module 179 of FIG. 1). The haptic module 279 may include, for example, a vibrator configured to generate vibrations. The haptic module 279 may be in the second housing 220. The haptic module 279 may be adjacent to the second sound output module 255B. The haptic module 279 may be in the first housing 210.

In one embodiment, the electronic device 201 may include a first camera module 280A (e.g., the camera module 180 of FIG. 1) and a second camera module 280B (e.g., the camera module 180 of FIG. 1). The first camera module 280A may be configured to obtain an image of one direction (e.g., the +Z direction) of the electronic device 201, and the second camera module 280B may be configured to obtain an image of the other direction (e.g., the −Z direction) of the electronic device 201.

In one embodiment, the first camera module 280A and the second camera module 280B may be in the second housing 220. At least one of the first camera module 280A and the second camera module 280B may be in the first housing 210. The electronic device 201 may include only one of the first camera module 280A and the second camera module 280B, or may further include an additional camera module in addition to the shown camera modules.

In one embodiment, the electronic device 201 may include a battery 289 (e.g., the battery 189 of FIG. 1). The battery 289 may be in the first housing 210. The battery 289 may be at least partially enclosed by, for example, the first sound output module 255A, the first camera module 280A, the second camera module 280B, a first PCB 251, the slide device 300, a third PCB 253, the haptic module 279, and the second sound output module 255B. The battery 289 may be in the second housing 220.

In one embodiment, the electronic device 201 may include the first PCB 251, a second PCB 252, and the third PCB 253. The first PCB 251, the second PCB 252, and the third PCB 253 may include a plurality of metal layers and a plurality of dielectrics each positioned between a pair of adjacent metal layers. The first PCB 251 may be in the second housing 220. The first PCB 251 may include a first electronic component (e.g., the power management module 188 of FIG. 1). The second PCB 252 may be in the first housing 210. For example, the second PCB 252 may be electrically connected to the slide device 300. The third PCB 253 may be in the second housing 220. For example, the third PCB 253 may be electrically connected to the haptic module 279.

In one embodiment, the electronic device 201 may include the housings 210 and 220. Specifically, the electronic device 201 may include a first cover 211, a first plate 212, a second plate 213, and a support structure 214, and the first cover 211, the first plate 212, the second plate 213, and the support structure 214 may together form the first housing 210. The electronic device 201 may include a second cover 221 and a third plate 222, and the second cover 221 and the third plate 222 may together form the second housing 220.

In one embodiment, the first cover 211 may partially enclose the first sound output module 255A, the first camera module 280A, the haptic module 279, and the second sound output module 255B. The first plate 212 may at least partially accommodate electronic components (e.g., the slide device 300, the first sound output module 255A, the second sound output module 255B, the first camera module 280A, the second camera module 280B, the first PCB 251, the second PCB 252, the third PCB 253, the haptic module 279, and other electronic components). The second plate 213 may be between the first plate 212 and the display module 261 and may support the slide device 300 and the display module 261.

In one embodiment, the support structure 214 may include a base plate 214A configured to flexibly bend and a plurality of support bars 214B arranged along the base plate 214A to be spaced apart from each other and configured to support the display module 261. The second cover 221 may be slidably coupled to the first cover 211 to at least partially enclose the first cover 211, where the first cover 211 is slidable relative to the second cover 221.

In one embodiment, the second cover 221 may be configured to guide the plurality of support bars 214B. The second cover 221 may expose at least a portion (e.g., the second camera module 280B) of an electronic component to the outside of the electronic device 201. The third plate 222 may enclose at least a portion of the second cover 221. The third plate 222 may be formed of, for example, a glass material. The structures of the first housing 210 and the second housing 220 described herein are not limited to the shown embodiments and may be various types of structures.

Figure 3A:
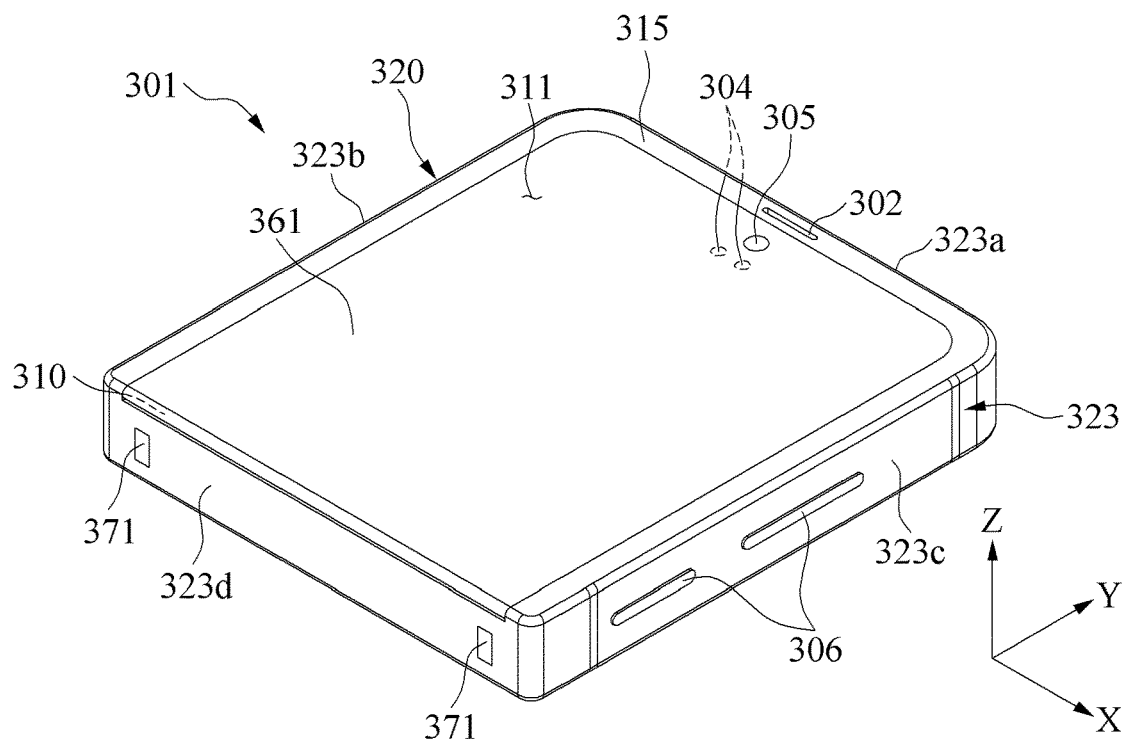
FIG. 3A is a front perspective view of an electronic device according to one embodiment.
Figure 3B:
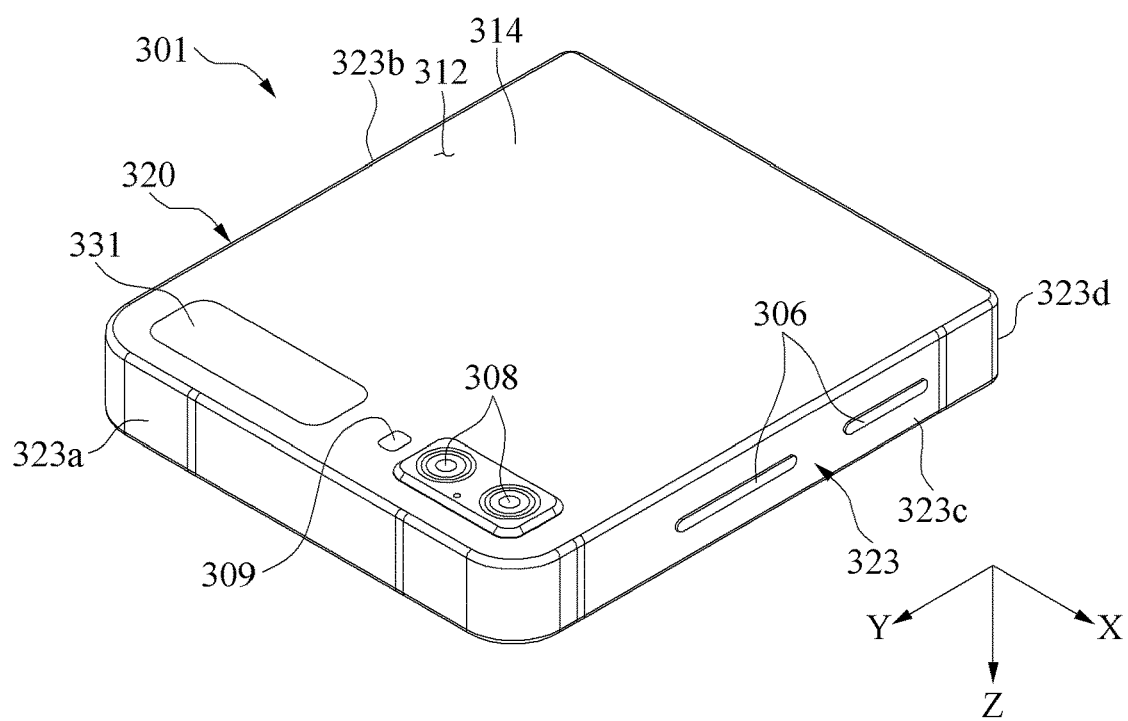
FIG. 3B is a rear perspective view of the electronic device according to one embodiment.
Figure 3C:
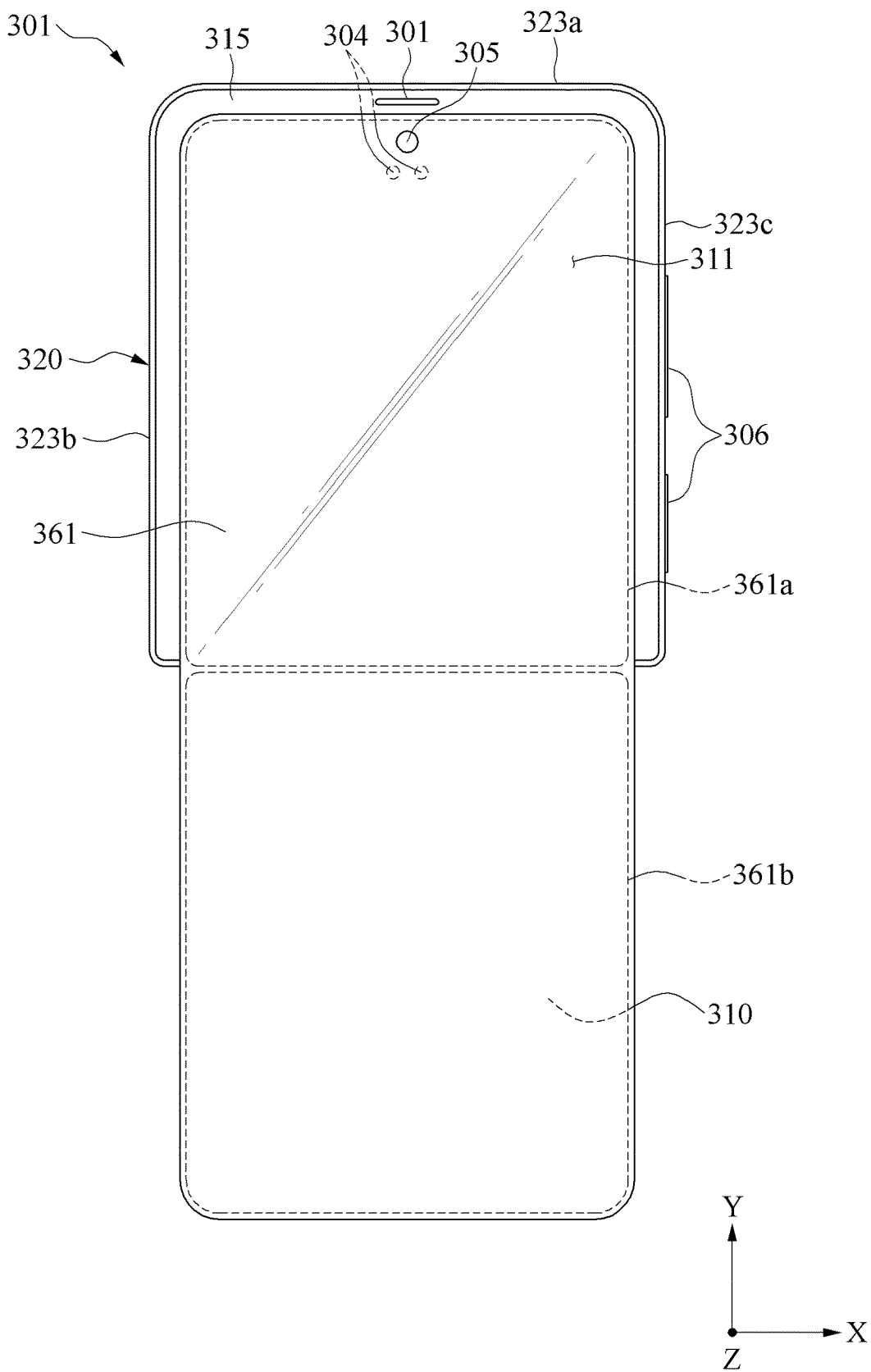
FIG. 3C is a front view of the electronic device according to one embodiment.
Figure 3D:
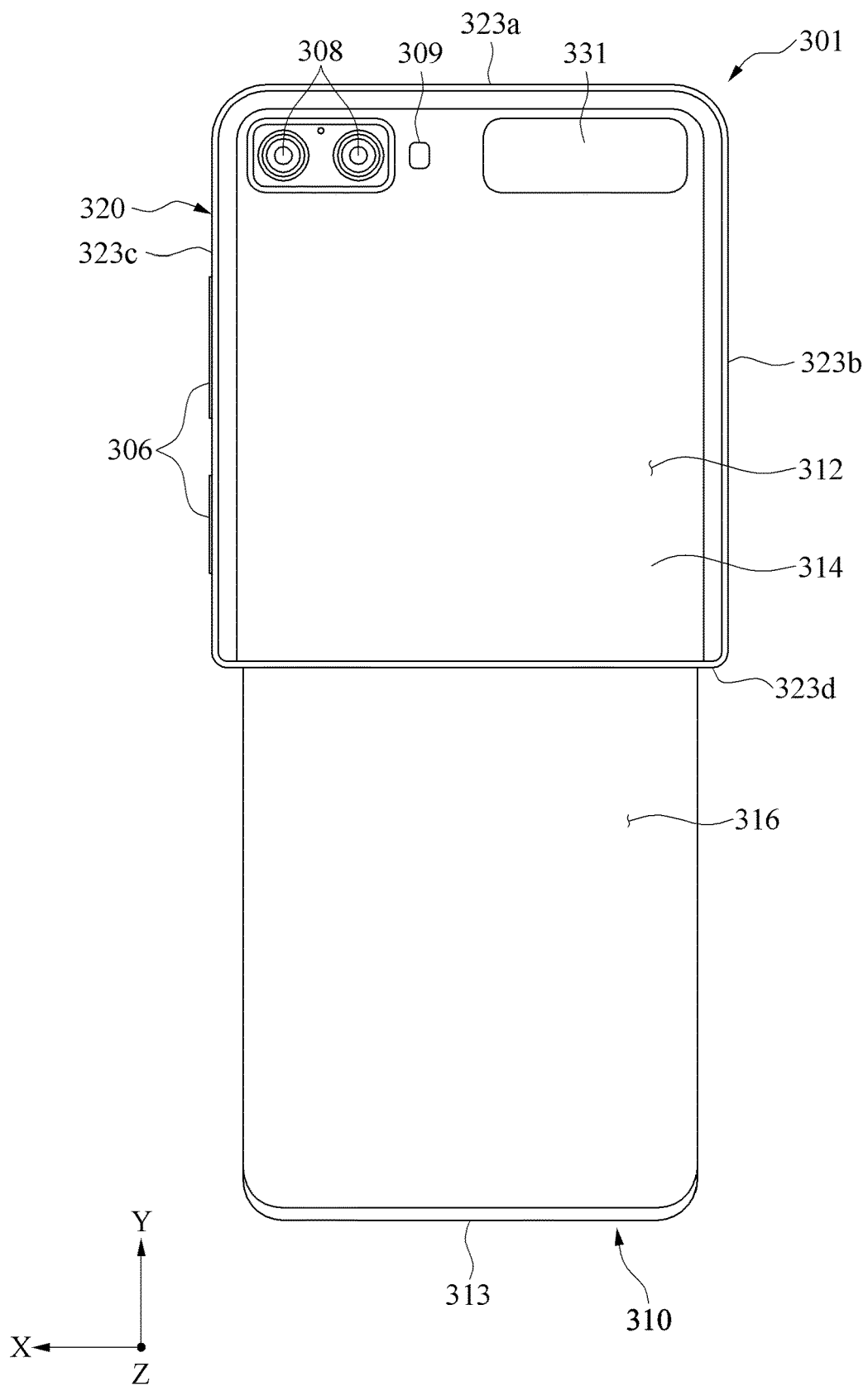
FIG. 3D is a rear view of the electronic device according to one embodiment.

FIG. 3A is a front perspective view of an electronic device according to one embodiment, FIG. 3B is a rear perspective view of the electronic device according to one embodiment, FIG. 3C is a front view of the electronic device according to one embodiment, and FIG. 3D is a rear view of the electronic device according to one embodiment. Specifically, FIGS. 3A and 3B are views when an electronic device 301 is in a "retracted state" and FIGS. 3C and 3D are views when the electronic device 301 is in an "expanded state".

Referring to FIGS. 3A to 3D, the electronic device 301 (e.g., the electronic device 101 of FIG. 1 or the electronic device 201 of FIG. 2A) may include housings 310 and 320. The housings 310 and 320 may include a first housing 310 and a second housing 320.

In one embodiment, a pair of housings 310 and 320 may include the first housing 310 and the second housing 320. The pair of housings 310 and 320 may include a first surface 311 facing a front surface (e.g., the +Z direction) of the electronic device 301 and a second surface 312 facing a direction opposite to the first surface 311.

In one embodiment, in the retracted state, the first housing 310 may be inside the second housing 320 (e.g., completely inside) or a partial region of the first housing 310 may be exposed to the outside of the second housing 320. In the expanded state, as the first housing 310 moves in the expansion direction (e.g., the −Y direction), the first housing 310 may be withdrawn from the inside of the second housing 320 to outside of the second housing 320. Alternatively, the first housing 310 may be inserted into the second housing 320 as the first housing 310 moves in the retraction direction (e.g., the +Y direction).

In one embodiment, the second housing 320 may include a side surface member 323 extending from the first surface 311 to the second surface 312. The side surface member 323 may include a first side surface 323a in one direction (e.g., the +Y direction), a second side surface 323b extending from one end of the first side surface 323a, a third side surface 323c extending from the other end of the first side surface 323a, and a fourth side surface 323d opposite to the first side surface 323a. The side surface member 323 may be formed in an oblong (e.g., square or rectangular) shape through the first side surface 323a, the second side surface 323b, the third side surface 323c, and the fourth side surface 323d. The second housing 320 may be open at the fourth side surface 232d, to provide an opening through which the first housing 310 is retractable into or expandable out of the second housing 320.+

In one embodiment, an auxiliary coupling unit 371 may be arranged at the side surface (e.g., the fourth side surface 323d) of the second housing 320, as described with reference to FIG. 4A. The pair of housings 310 and 320 is not limited to the shape and combination shown in the drawings and may be implemented in a different shape or a different combination and/or coupling of components.

In one embodiment, the side surface member 323 may be formed of a metal or may further include a polymer injected into the metal. The side surface member 323 may include at least one conductive portion that is electrically segmented through at least one segment formed of a polymer. The at least one conductive portion may be used as an antenna operating in at least one designated band (e.g., a legacy band) by being electrically connected to a wireless communication circuit included in the electronic device 301.

In one embodiment, a display module 361 (e.g., the display module 160 of FIG. 1 or the display module 261 of FIG. 2A) may be arranged on the first surface 311 of the pair of housings 310 and 320 and may expand or retract in interoperation with the movement of the first housing 310. A portion of the display module 361 may be arranged inside the pair of housings 310 and 320 and another portion of the display module 361 may be supported by being connected to the first housing 310. When the first housing 310 moves relative to the second housing 320, the display module 361 may move together with the first housing 310, and as the display module 361 is withdrawn from the inside of the housings 310 and 320 or inserted into the inside of the housings 310 and 320, the display module 361 which is expanded or retracted may increase or decrease a screen display area.

For example, the electronic device 301 may expand as the first housing 310 moves in the expansion direction (e.g., the −Y direction) from the side surface (e.g., the fourth side surface 323d) of the second housing 320 or may retract as the first housing 310 moves in the retraction direction (e.g., the +Y direction). An end 313 of the first housing 310 may be moved in the expansion direction of the first housing by a force provided from outside the electronic device 301 (e.g., by a user) or from a force provided from inside the electronic device 301 like a drive module (not shown) of the electronic device 301. As the first housing 310 expands, a surface 316 of the first housing 310 may be exposed to the outside of the housing 320 and outside of the electronic device 301. The first housing 310 may support the display module 361 disposed on the surface 316, and the display module 361 may expand or may retract with the surface 316 in interoperation with the movement of the first housing 310.

In one embodiment, as the display module 361 expands, the display module 361 may be exposed to the outside of the housings 310 and 320 (and to outside the electronic device 301) and may adjust an expanded display area. Referring to FIG. 3C, the display module 361 may be divided into a partial region 361a and the other partial region 361b (e.g., a remaining region). The partial region 361a may be a region moved from the inside of the housings 310 and 320 to the outside of the housings 310 and 320 as the display module 361 expands and the other partial region 361b may be a region that moves as the second housing 320 expands from a surface (e.g., the first surface 311). Compared to the retracted state, the expanded display module 361 may have an expanded screen display area through an area before expansion (e.g., the partial region 361a) and an expanded area (e.g., the other partial region 361b) and may provide a wide screen to the user.

In one embodiment, the electronic device 301 in the retracted state of FIGS. 3A and 3B may improve portability by reducing an overall size of the electronic device 301, and the electronic device 301 in the expanded state of FIGS. 3C and 3D may improve usability by providing a wide screen as the display module 361 expands.

In one embodiment, the electronic device 301 may include a first protective cover 315 (e.g., a first protective frame or a first decoration member) coupled along a periphery in a front surface direction (e.g., the +Z direction) of the housings 310 and 320 and a second protective cover 325 coupled along a periphery in a rear surface direction (e.g., the −Z direction). The first protective cover 315 and/or the second protective cover 325 may be formed of a metal or a polymer material, and the first protective cover 315 and/or the second protective cover 325 may be used as a decoration member. The first protective cover 315 and/or the second protective cover 325 may be formed of, for example, any one or any combination of any two or more of coated or tinted glass, ceramic, a polymer, and a metal (e.g., aluminum, stainless steel (STS), or magnesium).

In one embodiment, the electronic device 301 may include at least one of a sound output device 302 and camera devices 305 and 308. They may correspond to the sound output module 155 and the camera module 180 of FIG. 1 or the first and second sound output modules 255A and 255B and the first and second camera modules 280A and 280B of FIG. 2. A repeated description of the structure described above is omitted.

In one embodiment, the electronic device 301 may include a sensor module 304 (e.g., the sensor module 176 of FIG. 1). The sensor module 304 may generate an electrical signal or a data value corresponding to an internal operating state of the electronic device 301 or an external environmental state. For example, the sensor module 304, which is an illuminance sensor, may be arranged under the display module 361 to detect an external environment through the display module 361.

In one embodiment, the sensor module 304 may include at least one of a gesture sensor, a gyro sensor, an atmospheric pressure sensor, a magnetic sensor, an acceleration sensor, a grip sensor, a color sensor, an IR sensor, a biometric sensor, a temperature sensor, a humidity sensor, an illuminance sensor, a proximity sensor, and an ultrasonic sensor.

In one embodiment, the camera devices 305 and 308 may include a first camera device 305 (e.g., a front camera device) on the first surface 311 of the second housing 320 and a second camera device 308 on the second surface 312 of the second housing 320. The electronic device 301 may further include a flash 309 arranged near the second camera device 308. The camera devices 305 and 308 may include one or more lenses, an image sensor, and/or an ISP.

In one embodiment, the flash 309 may include, for example, a light-emitting diode (LED) or a xenon lamp. The camera devices 305 and 308 may be arranged such that two or more lenses (e.g., a wide-angle lens, an ultra-wide lens, or a telephoto lens) and image sensors are disposed on the electronic device 301. The camera devices 305 and 308 may include a lens for time of flight (TOF) and/or an image sensor.

In one embodiment, a key input device 306 (e.g., a key button) may be on the third side surface 323c of the side surface member 323 of the second housing 320. The key input device 306 may be on the other side surfaces 323a or 323b of the second housing 320 and/or at least one side surface of the first housing 310. The electronic device 301 may not include some or all of the key input devices 306, and the key input devices 306 that are not included may be implemented in another form, such as a soft key on the display module 361. The key input device 306 may be implemented by using a pressure sensor included in the display module 361.

Figure 4A:
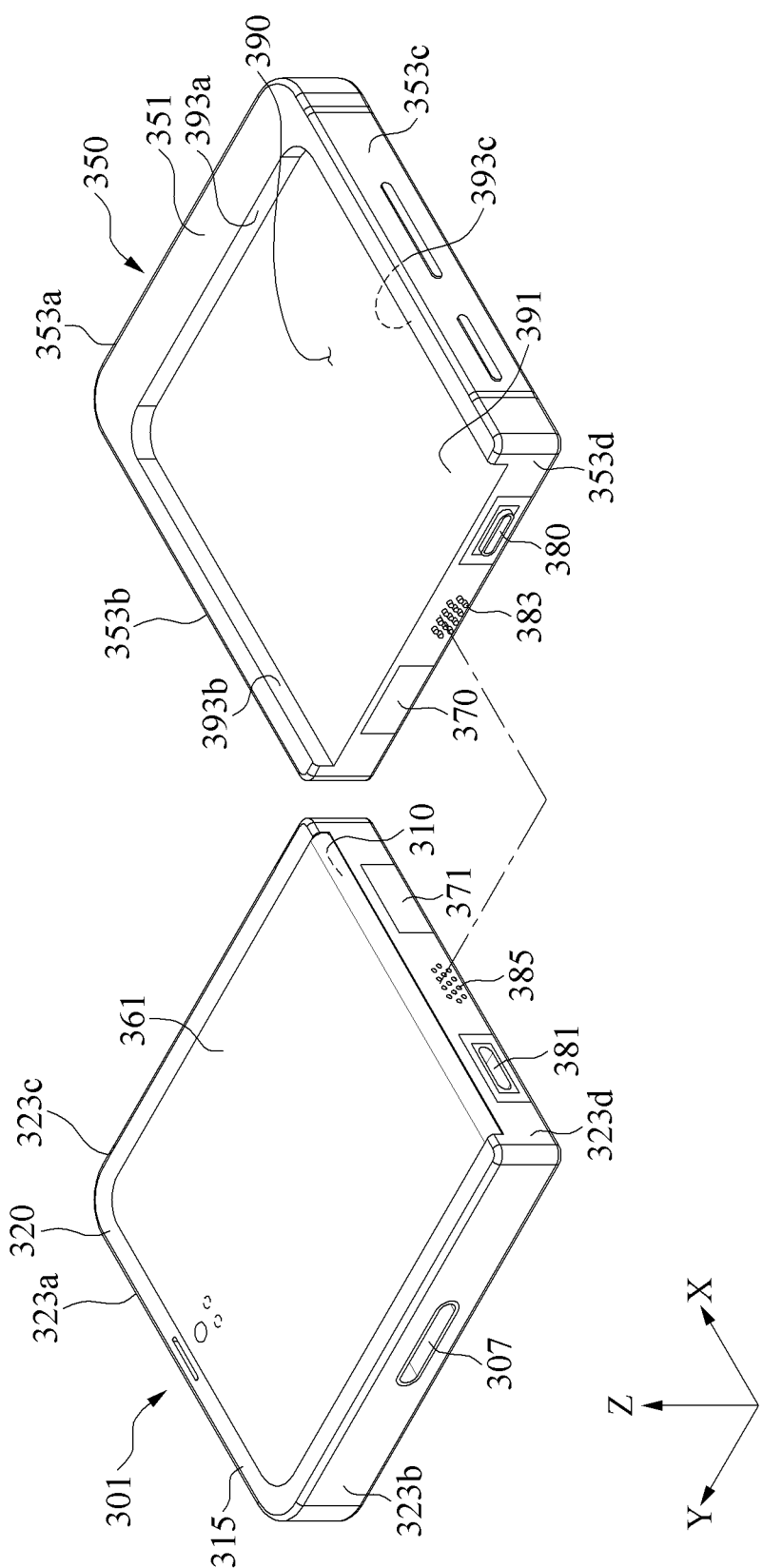
FIG. 4A is a perspective view of an electronic device and an accessory device according to one embodiment.
Figure 4B:
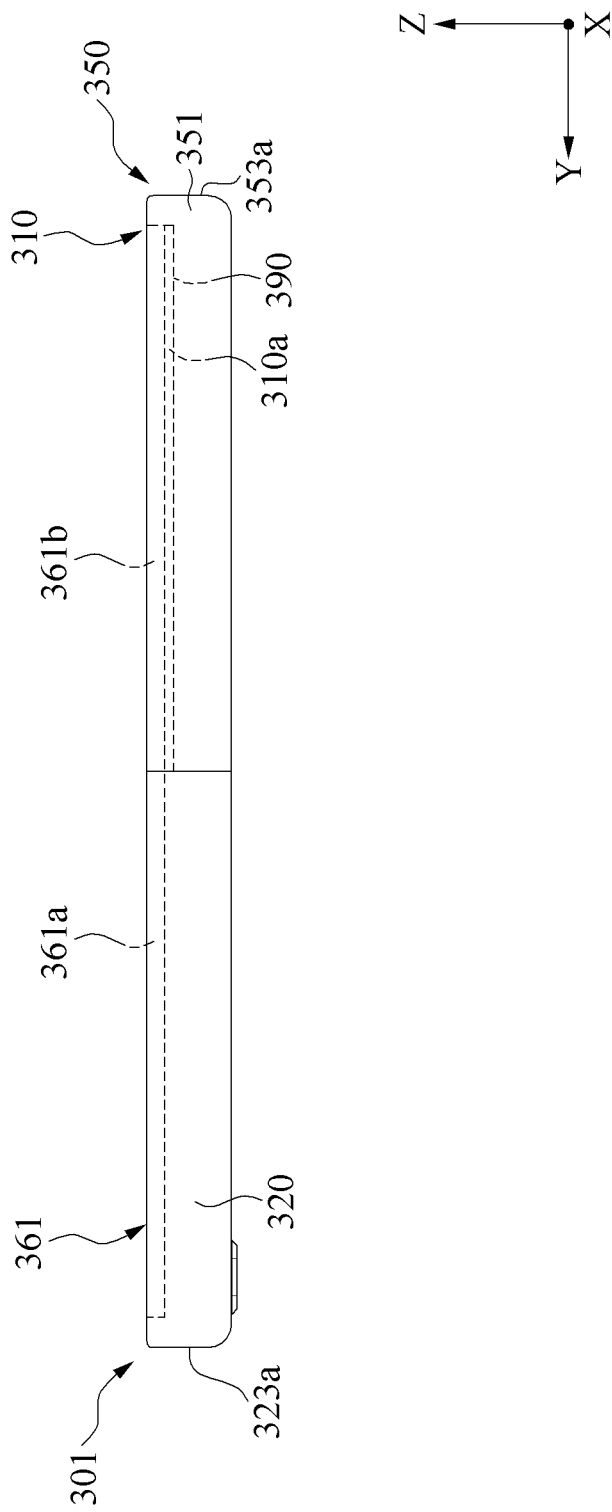
FIG. 4B is a side view of the electronic device and the accessory device according to one embodiment.

FIG. 4A is a perspective view of the electronic device 301 and an accessory device 350 according to one embodiment, and FIG. 4B is a side view of the electronic device 301 and the accessory device 350 according to one embodiment.

Referring to FIGS. 4A and 4B, the electronic device 301 may include the accessory device 350 that is attachable. The accessory device 350 may be removably attachable to the electronic device 301, at various surfaces and/or components of the electronic device 301.

In one embodiment, the accessory device 350 may be coupled to or separated from the housings 310 and 320 of the electronic device 301. When the electronic device 301 is in the retracted state (e.g., the electronic device 301 which is completely retracted), the accessory device 350 may be separated from the electronic device 301 and carried, separately operate, or be charged. When the electronic device 301 is in the expanded state (e.g., the electronic device 301 which is partially or completely expanded), the accessory device 350 may be coupled to the electronic device 301 to support the expanded area of the electronic device 301 and may improve the performance of the electronic device 301 based on an internal component of the accessory device 350. The accessory device 350 may be a separate product manufactured and/or sold separately from the electronic device 301, or the accessory device 350 may be manufactured and sold with the electronic device 301 and may be attached to the electronic device 301 and used according to the needs of the user. The accessory device 350 may supplement a function of the electronic device 301 and/or provide an additional function of the electronic device 301.

In one embodiment, the accessory device 350 may include a main body 351 including a mounting surface 390 and a coupling unit 370. The mounting surface 390 may be a region where an expanded area of the first housing 310 (e.g., the partial region 310a of the first housing 310) exposed to the outside of the second housing 320 by moving from the second housing 320, is mounted. The mounting surface 390 may support the expanded area 361b of the display module 361. The mounting surface 390 may otherwise be referred to as a mounting portion or a supporting portion, and may be defined by a plurality of surfaces of the main body 351. The mounting surface 390 may be defined in the form of a recess, a groove or stepped structure, defined by various portions of the main body 351. The mounting surface 390 may also be considered a surface with which a recess or groove is defined.

In one embodiment, as the display module 361 expands, a partial region of the display module 361 may move relative to the second housing 320 and may be or define the "expanded area 361b" by protruding out if the upper surface of the second housing 320, and the other region (e.g., remaining region) may remain inside of the housings 310 and 320, located on the upper surface of the second housing 320 and be or define the "area 361a before expansion". As the display module 361 moves, the "area 361a before expansion" may substantially become the expanded area withdrawn from the electronic device 301. However, hereinafter, based on a state after expansion, an area on the upper surface of the second housing 320 may be the partial region 361a before expansion and an area escaping from the second housing 320 may be the expanded area 361b.

In one embodiment, the second housing 320 may be larger and heavier than the first housing 310, and the first housing 310 may be relatively smaller and lighter than the second housing 320. For example, the second housing 320 may include various components, such as a battery, a processor, and a memory, and a weight of the first housing 310 may be limited or minimized since the first housing 310 is movable, and thus, the second housing 320 may be heavier than the first housing 310. The partial region 361a before expansion may be supported by the first housing 310 and the second housing 320, the expanded area 361b may be supported by the first housing 310 and the accessory device 350, and the display module 361 may be stably protected.

In one embodiment, for example, when the accessory device 350 is not attached to the electronic device 301, since an area expanded from the display module 361 is protected or supported only by the first housing 310, the area may be relatively vulnerable to damage. Alternatively, when the electronic device 301 is gripped along in the horizontal direction (e.g., the +/−Y direction), gripping may be inconvenient due to the structure of the electronic device 301 and a difference between both ends of the electronic device 301. Alternatively, when the electronic device 301 is used on an external support body (not shown), such as a floor or a table, the height relative to the external support surface, of the first housing 310 which is protruded outside of the second housing 320, may be different from the height relative to the external support surface, of the second housing 320, one surface (e.g., the surface 316 of FIG. 3D) of the first housing 310 may be apart from the external support body (not shown), and the electronic device 301 may shake or may have a difficulty in touch recognition when the user touches the expanded area 361b.

Referring to FIG. 4B, for example, the lower surface of the expanded area 310a may correspond to the surface 316 in FIG. 3D, and may be in a different plane than the lower surface of the second housing 320 which corresponds to the surface 312 in FIG. 3D. That is, where the lower surface of the second housing 320 corresponds to the external support surface, without the accessory device 350 attached to the electronic device 301, the lower surface of the expanded area 310a would be further from the external support surface than the lower surface of the second housing 320. As such, the accessory device 350 may compensate for a step difference between the lower surface of the expanded area 310a (e.g., surface 316 in FIG. 3D) and the lower surface of the second housing 320 (e.g., surface 312), and more stably support the expanded areas defined as portions of the display module 361 and the first housing 310.

Referring again to FIG. 4B, the accessory device 350 includes the main body which is detachably attachable to an electronic device 301 (including a housing having a planar size which is expandable in an expansion direction to define an expanded area of the housing, and a display module which is expandable in the expansion direction, together with the housing, to define an expanded area of the display module). The main body includes a mounting surface extended in the expansion direction, and the accessory device which is attached to the electronic device includes the mounting surface supporting the expanded area of the housing together with the expanded area of the display module. Further to this, the housing may include the first housing which is moveable relative to the second housing. The display module may be connected to the housing, and may be extendable in the expansion direction and retractable in the retraction direction, together with the first housing, to provide a display screen of the electronic device which is variable in size.

In one embodiment, the accessory device 350 may be attached to the electronic device 301 as necessary according to a usage environment of the electronic device 301, may protect the display module 361 by supporting the first housing 310 having the display module 361 thereon, may provide unity of shape and weight of the electronic device 301 in (or along) the horizontal direction, and may secure convenience of using the electronic device 301 which is expanded.

In one embodiment, the accessory device 350 may support and protect the expanded areas that are expanded from the electronic device 301 and may customize the usability of the electronic device 301 according to the needs of the user through various components included in the accessory device 350. The usability of the electronic device 301 may be customized by providing a function to the electronic device 301, providing an aesthetic appearance to the electronic device 301, etc. A description of improving usability of the accessory device 350 is provided with reference to FIGS. 8A to 8C.

In one embodiment, the electronic device 301 may reduce the number of components included inside the electronic device 301, may secure an internal space, and may realize miniaturization and slimness. When the electronic device 301 includes a component requiring a space, such as a battery module (e.g., a battery module 353 of FIG. 8A), a camera module (e.g., an input module 355 of FIG. 8B), a sound output module (e.g., a sound output module 356 of FIG. 8C), the electronic device 301 may be heavy or large and the user may be inconvenienced to carry the electronic device 301. By including a high-performance functional component in the accessory device 350 according to the needs of the user and including an essential component required to drive the electronic device 301 or a general performance component in the electronic device 301, the electronic device 301 may be miniaturized and slim, economic feasibility in manufacturing may be secured, and the electronic device 301 may be customized for the user through the accessory device 350.

In one embodiment, the main body 351 may accommodate the first housing 310 and may have a shape corresponding to the exterior of the second housing 320. The main body 351 may include an upper surface facing a screen display direction of the display module 361 and a plurality of side surfaces 353a, 353b, 353c, and 353d extending from the upper surface. The plurality of side surfaces 353a, 353b, 353c, and 353d may include a first side surface 353a facing the expansion direction, a second side surface 353b opposite to the first side surface 353a and facing the retraction direction, and both side surfaces 353c and 353d extending from the first side surface 353a to the second side surface 353b.

In one embodiment, the mounting surface 390 may be provided on the upper surface of the main body 351. The mounting surface 390 may include a bottom surface 391 that supports the expanded area 310a of the first housing 310 and a plurality of inner side surfaces 393a, 393b, and 393c extending from the bottom surface 391. The plurality of inner side surfaces 393a, 393b, and 393c may include a first inner surface 393c facing the expansion direction and both inner side surfaces 393b and 393c extending from the first inner side surface 393a to both sides of the mounting surface 390. The various inner side surfaces together with the bottom surface 391 may define a recess (e.g., such as a coupling groove 375a) in which expanded portions of the display module 361 and the first housing 310 are disposed.

In one embodiment, the side surface 323d in the expansion direction of the second housing 320 of the electronic device 301, may be coupled to the accessory device 350 in a direction facing the side surface 353*d* of the accessory device 350.

In one embodiment, an external connecting terminal 307 may be provided on at least one of the plurality of side surfaces 323*a*, 323*b*, 323*c*, and 323*d* of the electronic device 301. For example, among the plurality of side surfaces 323*a*, 323*b*, 323*c*, and 323*d*, the external connecting terminal 307 may be provided on one of the second side surface 323*b* and the third side surface 323*c* facing the expansion direction and adjacent to the fourth side surface 323*d* coupled to the accessory device 350. When the accessory device 350 is coupled to or separated from the electronic device 301, the user may charge the electronic device 301 and/or the accessory device 350 or may transmit/receive data from the outside, through the external connecting terminal 307.

In one embodiment, the external connecting terminal 307 may be provided on at least one of the plurality of side surfaces 323*a*, 323*b*, 323*c*, and 323*d* of the electronic device 301 and at least one of the plurality of side surfaces 353*a*, 353*b*, 353*c*, and 353*d* of the accessory device 350. When the external connecting terminal 307 is provided at the accessory device 350, the accessory device 350 may be independently charged and may transmit/receive data from the outside and be separated from the electronic device 301.

However, the example is not limited thereto. The external connecting terminal 307 may be provided on a partial region of the main body 351, the housings 310 and 320 of the accessory device 350, and the electronic device 301.

In one embodiment, the plurality of side surfaces 323*a*, 323*b*, 323*c*, and 323*d* of the electronic device 301 and the plurality of side surfaces 353*a*, 353*b*, 353*c*, and 353*d* of the accessory device 350 may be side surfaces in a plane (e.g., an X-Y plane) direction when viewing the electronic device 301 and the accessory device 350 in a screen display direction (e.g., the +Z direction) of the electronic device 301. In a coupled state, the side portions which define the side surfaces 323*c* and 323*b* of the second housing 320 of the electronic device 301 may be coupled to and aligned with side portions which define the inner side surfaces 393*b* and 393*c* of the main body 351 of the accessory device 350, respectively, and the side surface 323*a*, in the retraction direction, of the second housing 320 may be opposite to the inner side surface 393*a* of the main body 351 of the accessory device 350 along a length of the accessorized electronic device. Some side surfaces 323*d* and 353*d* may face each other along a connection direction (e.g., Y direction) in the accessorized electronic device. The side surfaces 323*d* and 353*d* may contact each other, such as to form an interface therebetween, without being limited thereto. The second housing 320 and the main body 351 may have structures corresponding to each other to provide unity in the exterior and in the coupled state, the second housing 320 and the main body 351 may substantially have continuous structures.

In one embodiment, the coupling unit 370 may detachably couple or removably attach the main body 351 of the accessory device 350, to the housings 310 and 320 of the electronic device 301. The coupling unit 370 may be arranged in a direction facing the housings 310 and 320 from the main body 351, and may be provided on the side surface 353*d* of the main body 351. The coupling unit 370 may be implemented in various shapes and structures, such as a magnetic body, a hook, a bracket, and a bent structure.

In one embodiment, the accessory device 350 and the electronic device 301 may respectively include the coupling unit 370 (e.g., a first coupling member) and the auxiliary coupling unit 371 (e.g., a second coupling member) coupling and supporting each other. The auxiliary coupling unit 371 may be provided at the surface 323*d* of the housings 310 and 320 in the expansion direction and may be arranged to face the coupling unit 370 when the accessory device 350 is coupled to the electronic device 301. The auxiliary coupling unit 371 may be implemented in various structures that may fasten the coupling unit 370 corresponding to the structure, shape, and location of the coupling unit 370.

In one embodiment, the accessory device 350 may include a connecting unit 380 configured to electrically connect the electronic device 301 to the accessory device 350. The connecting unit 380 may be arranged in a direction facing the housings 310 and 320 from the main body 351, and may be provided on the surface 353*d* of the main body 351. The connecting unit 380 may include a connecting terminal physically connectable to the electronic device 301. The connecting terminal may be connected to the electronic device 301 and may transmit/receive at least one of an electrical signal and power to/from the accessory device 350.

In one embodiment, the accessory device 350 and the electronic device 301 may include the connecting unit 380 and an auxiliary connecting unit 381 electrically connecting to each other. The auxiliary connecting unit 381 may be provided on the surface 323*d* of the housings 310 and 320 in the expansion direction and may be arranged to face the connecting unit 380 when the accessory device 350 is coupled the electronic device 301. The auxiliary connecting unit 381 may be implemented in various structures that may connect to the connecting unit 380 corresponding to the size and location of the connecting unit 380.

In one embodiment, the accessory device 350 and the electronic device 301 may include a connecting pin 383 and a connecting groove 385, respectively, for connecting to each other. The accessory device 350 and the electronic device 301 may include a plurality of connecting pins 383 and a plurality of connecting grooves 385, respectively, and the connecting pin 383 may be inserted into the connecting groove 385. The connecting pin 383 may be provided on the side surface 353*d* of the main body 351, and the connecting groove 385 may be provided in the surface 323*d* of the housings 310 and 320 in the expansion direction. The connecting pin 383 and the connecting groove 385 may be arranged to face each other when the accessory device 350 is coupled to the electronic device 301.

In one embodiment, the connecting pin 383 may function as the coupling unit 370 or the connecting unit 380 or may simultaneously function as the coupling unit 370 and the connecting unit 380. The connecting pin 383 may be implemented by a jig pin or a pogo pin, which is a cylindrical spring pin, and may physically and/or electrically connect the accessory device 350 to the electronic device 301. One or more of the pairs of the coupling unit 370 and the auxiliary coupling unit 371, the connecting unit 380 and the auxiliary connecting unit 381, and the connecting pin 383 and the connecting groove 385 may provide a coupling structure which removably attaches the electronic device 301 to the accessory device 350. That is, the coupling unit which detachably attaches the main body of the accessory device to the housing of the electronic device, may also electrically connect the electronic device to the accessory device. In an embodiment, the electronic device 301 may be removably attachable to the accessory device 350 solely by one of the pairs of mating coupling structures noted above.

In one embodiment, the connecting unit 380 may include a wireless communication module (not shown) configured to wirelessly connect the accessory device 350 to the electronic device 301. The connecting unit 380 may not physically connect the accessory device 350 to the electronic device 301 and may be wirelessly connected to the electronic device 301 and transmit/receive an electrical signal to/from the electronic device 301, or may transmit/receive power through a wireless charging method. The wireless communication module (not shown) may detect and automatically connect the electronic device 301 to the accessory device 350 when the electronic device 301 is adjacent to the accessory device 350, such as Bluetooth or a near field communication (NFC) tag.

In one embodiment, although FIG. 4A illustrates that the coupling unit 370, the connecting unit 380, and the connecting pin 383 are separate units, this is an example to describe the coupling between the accessory device 350 and the electronic device 301. The actual implementation is not limited thereto. For example, the accessory device 350 may include only one of the coupling unit 370, the connecting unit 380, and the connecting pin 383. Alternately, one structure included in the accessory device 350 may simultaneously function as any two or more of the coupling unit 370, the connecting unit 380, and the connecting pin 383.

For example, when there is a C-type or A-type connecting terminal, the connecting terminal may be the connecting unit 380 or the connecting pin 383. Since the connecting terminal is inserted into the housings 310 and 320 and supports the main body 351, the connecting terminal may be included in the coupling unit 370.

Hereinafter, to describe the accessory device 350 attachable to the housings 310 and 320 of the electronic device 301, repeated descriptions thereof are omitted and the various coupling and connecting methods of the accessory device 350 and the electronic device 301 and the structure of the accessory device 350 are mainly described.

Figure 5A:
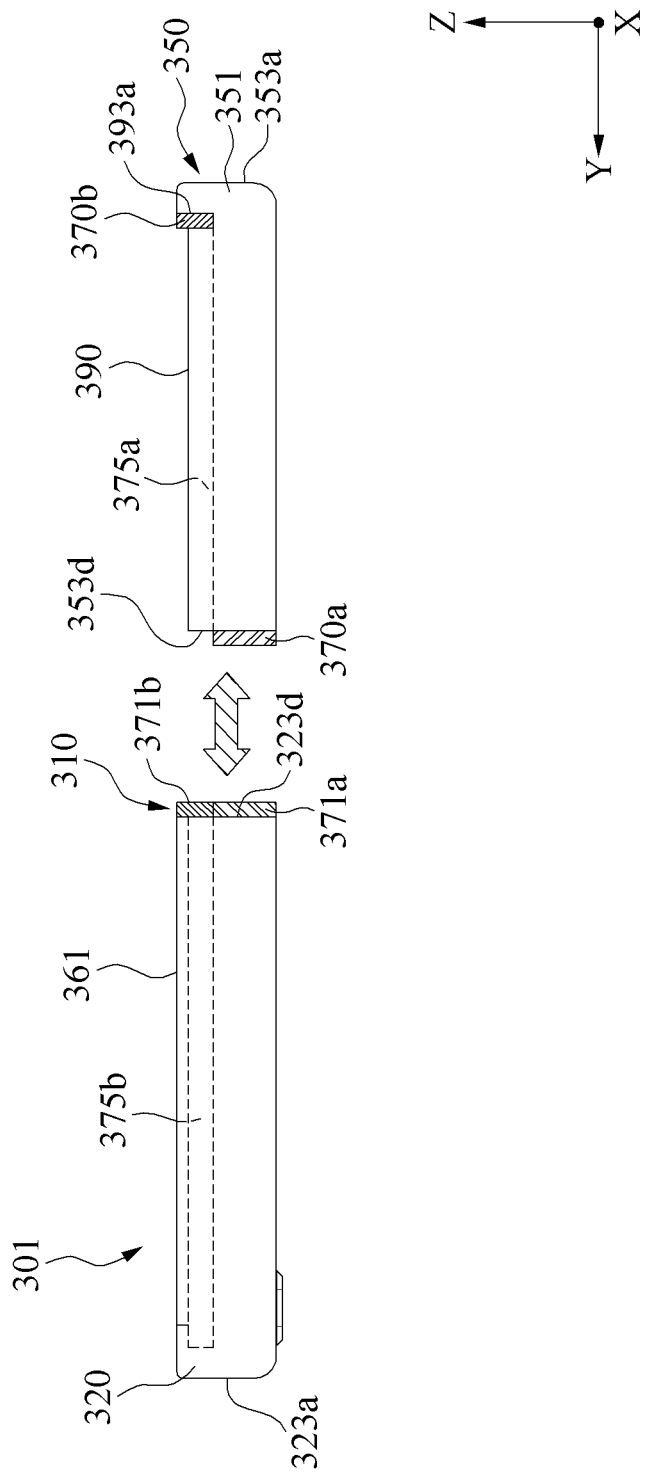
FIG. 5A is a side view of the electronic device and the accessory device according to one embodiment.
Figure 5B:
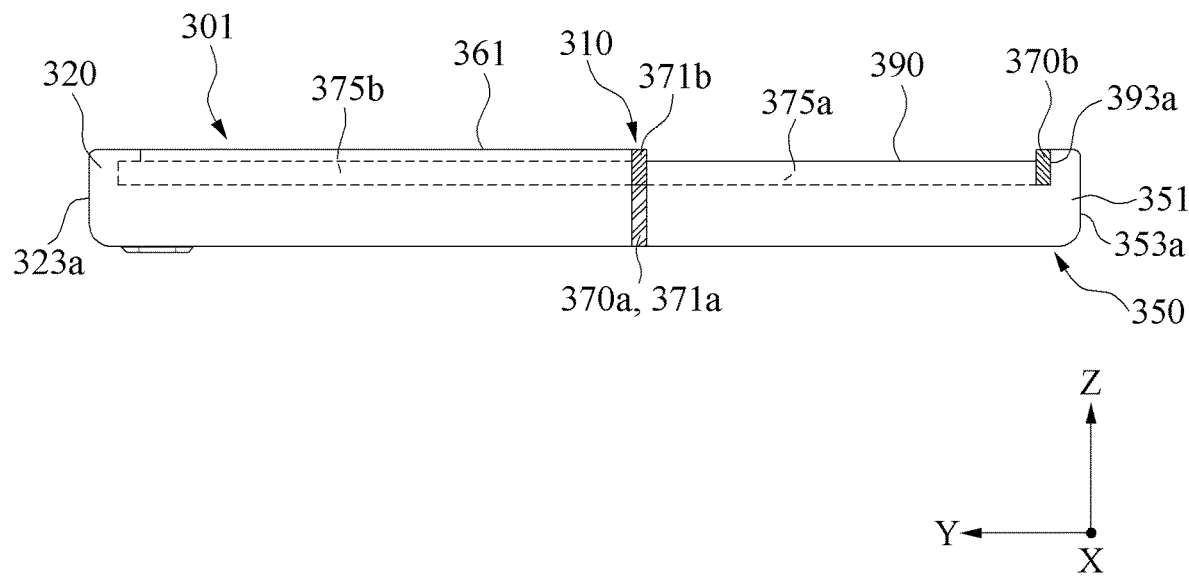
FIG. 5B is a side view of the electronic device and the accessory device according to one embodiment.
Figure 5C:
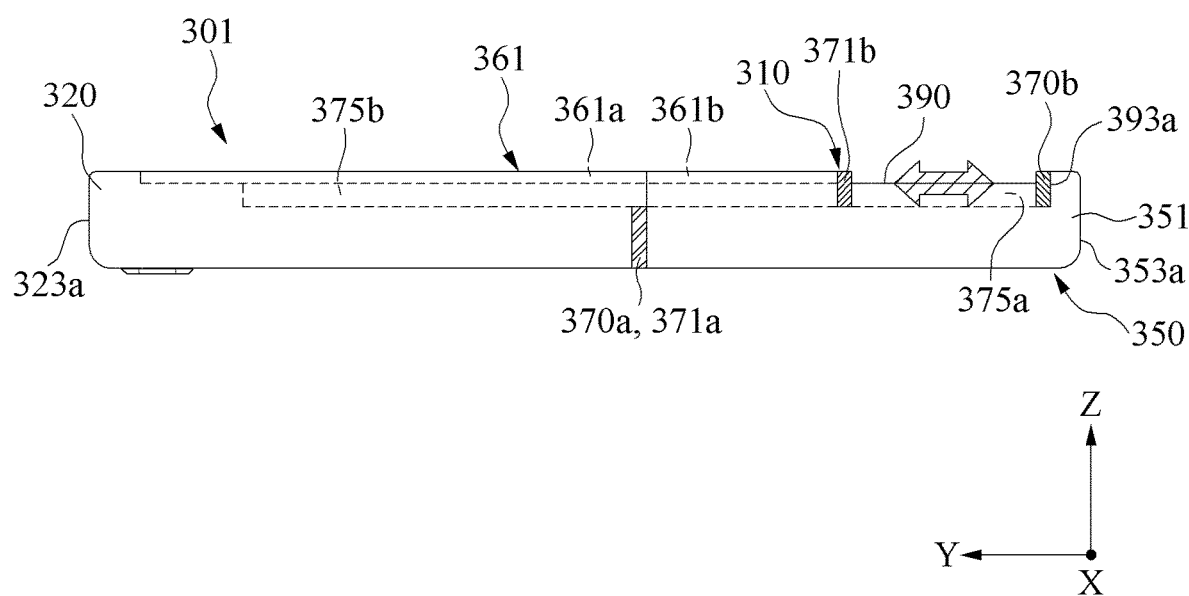
FIG. 5C is a side view of the electronic device and the accessory device according to one embodiment.
Figure 5D:
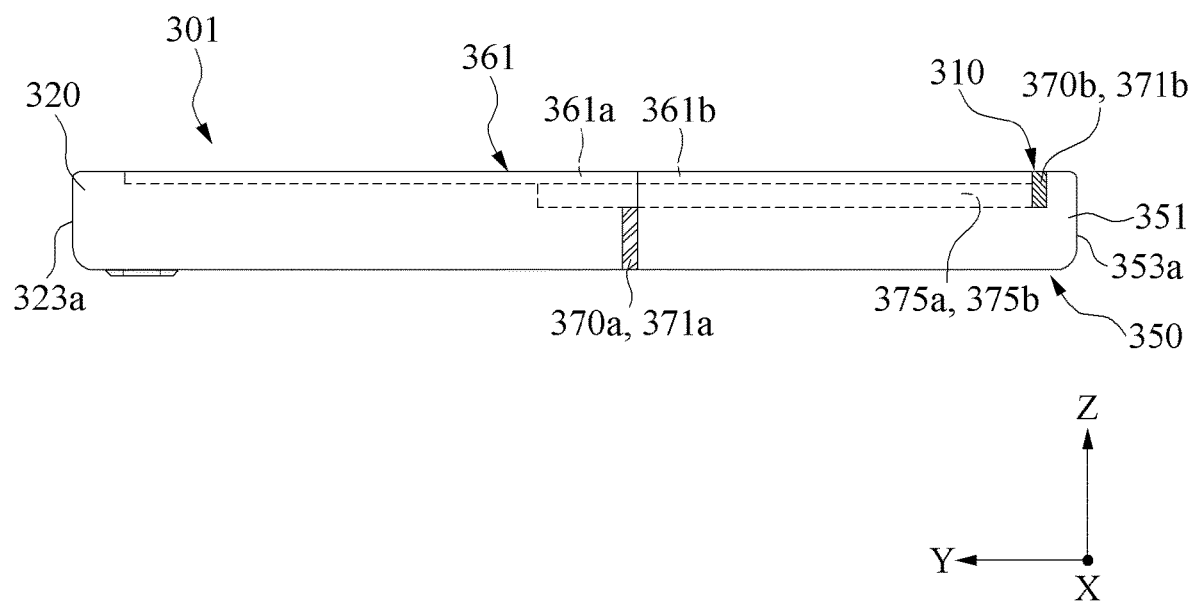
FIG. 5D is a side view of the electronic device and the accessory device according to one embodiment.

FIG. 5A is a side view of the electronic device 301 and the accessory device 350 according to one embodiment, FIG. 5B is a side view of the electronic device 301 and the accessory device 350 according to one embodiment, FIG. 5C is a side view of the electronic device 301 and the accessory device 350 according to one embodiment, and FIG. 5D is a side view of the electronic device 301 and the accessory device 350 according to one embodiment.

Referring to FIGS. 5A to 5D, the coupling unit 370 may include a first coupling unit 370a and a second coupling unit 370b.

In one embodiment, the coupling unit 370 may be provided in a region contacting the housings 310 and 320 in the main body 351 and may include a magnetic body electromagnetically interacting with the housings 310 and 320. In this case, the housings 310 and 320 may include an auxiliary magnetic body facing the magnetic body in the coupled state. The magnetic body and the auxiliary magnetic body may be formed of magnetite having magnetism or a metal including a magnetic material. Alternatively, one of the magnetic body and the auxiliary magnetic body may include an electromagnetic induction device generating an electromagnetic force and may generate an attractive force using a mutual electromagnetic force.

In one embodiment, a plurality of coupling units 370 may be provided and may include the first coupling unit 370a and the second coupling unit 370b. The first coupling unit 370a may be provided at an end of the main body 351 (e.g., the side surface 353d), for example, one end contacting the second housing 320, and may support the main body 351 when the main body 351 is coupled to the housings 310 and 320. The second coupling unit 370b may be provided on the expanded area of the first housing 310 in the main body 351 and may be coupled to the first housing 310 when the first housing 310 is in the expanded state. The second coupling unit 370b may be provided on the inner side surface 393a of the mounting surface 390.

In one embodiment, the electronic device 301 may include a first auxiliary coupling unit 371a coupled to the first coupling unit 370a, and a second auxiliary coupling unit 371b coupled to the second coupling unit 370b. The first coupling unit 370a may be provided at the end 323d, of the second housing 320, facing the accessory device 350, and the second auxiliary coupling unit 371b may be provided at one end of the first housing 310 in the expansion direction. In an embodiment the coupling unit includes the first coupling unit provided at a first end of the main body which is closest to the housing, and the second coupling unit provided at a second end of the main body which is opposite to the first end. The accessory device 350 which is attached to the electronic device 301 includes the first coupling unit coupled to a non-expanded area of the housing, and the second coupling unit coupled to the expanded area of the housing.

Hereinafter, a description of an operation of coupling the accessory device 350 to the electronic device 301 and an operation of expanding the electronic device 301 is provided with reference to FIGS. 5A to 5D.

Referring to FIGS. 5A and 5B, the electronic device 301 may approach the accessory device 350 by a predetermined distance or more, and the first coupling unit 370a and the first auxiliary coupling unit 371a may generate a mutual attractive force, indicated by the double-headed arrow in FIG. 5A. The first coupling unit 370a may guide the accessory device 350 such that the accessory device 350 may be coupled to an appropriate location of the electronic device 301.

Referring to FIGS. 5C and 5D, the display module 361 may extend as the first housing 310 moves and when the display module 361 extends over a predetermined length, the second coupling unit 370b and the second auxiliary coupling unit 371b may generate a mutual attractive force, indicated by the double-headed arrow in FIG. 5C. The second coupling unit 370b may guide the first housing 310 and the display module 361 such that the first housing 310 and the display module 361 may be coupled to an appropriate position of the mounting surface 390. FIG. 5D shows a completed coupling of the electronic device 301 to the accessory device 350. From the complete coupling of FIG. 5D, the accessory device 350 may be separated from the electronic device 301 such as by providing an external force greater than the attractive force applied to the coupling unit 370 and the auxiliary coupling unit 371.

In one embodiment, the coupling unit 370 of the accessory device 350 may be provided adjacent to the mounting surface 390 of the main body 351 and may include or define a coupling groove 375a in a shape corresponding to the shape of the expanded area of the first housing 310, which is defined by an outer surface of the first housing 310 (e.g., an outer shape). For example, the first housing 310 may include a bracket 375b provided on a surface facing the mounting surface 390 in the coupled state and the coupling groove 375a may have a shape corresponding to the bracket 375b. The bracket 375b may be inserted into the coupling groove 375a and fixed while the first housing 310 expands.

In an embodiment, the bracket 375b of the first housing 310 and the display module 361 may each be fixed to the second auxiliary coupling unit 371b, and movable together with each other (refer to FIGS. 5C and 5D). Distal ends of the bracket 375b of the first housing 310 and the display module 361 may be fixed to the second auxiliary coupling unit 371b. A length of the bracket 375b along the Y direction may be equal to or less than a length of the coupling groove 375a along the Y direction. Referring to FIG. 5D, a portion of the bracket 375b may remain within the second housing 320, even when the first housing 310 (or the display module 361) is in full extension.

When the electronic device 301 is coupled to the accessory device 350, the bracket 375b may guide the first housing 310 to move in a preset direction and may support the first housing 310 to be fixed to the mounting surface 390. The coupling groove 375a and the bracket 375b may be one of the examples of the coupling unit 370 and the auxiliary coupling unit 371.

Figure 6:
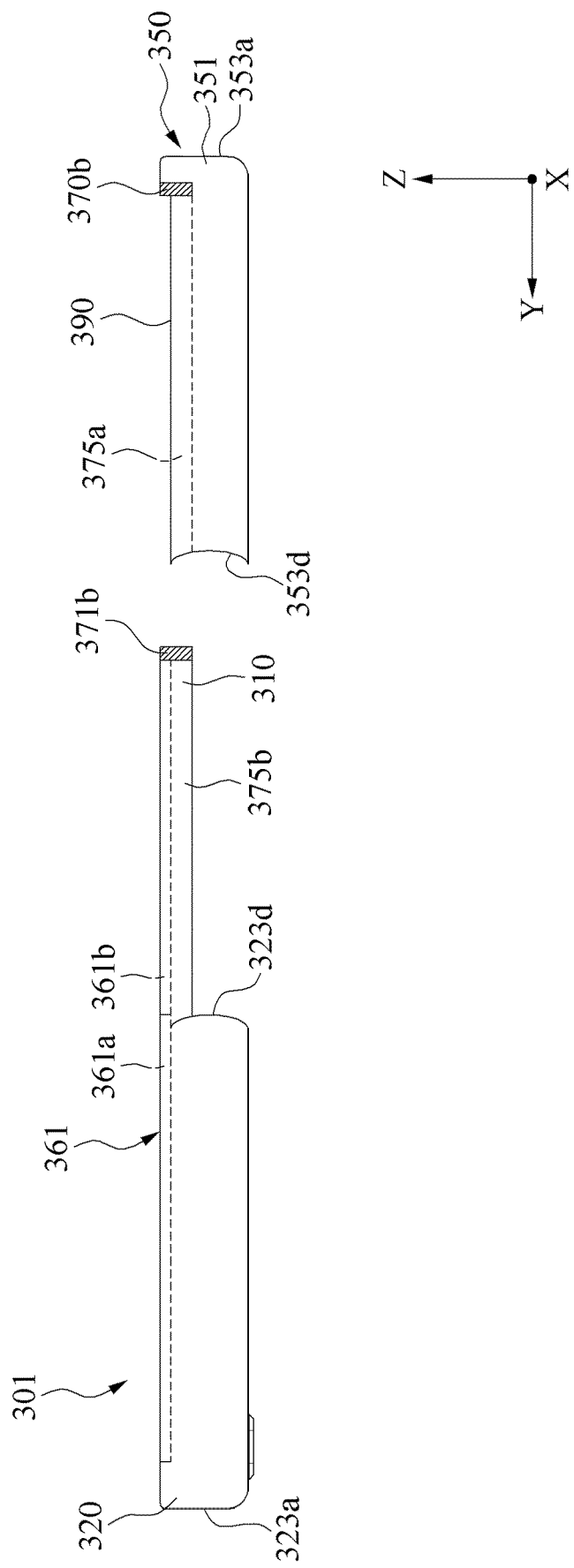
FIG. 6 is a side view of an electronic device and an accessory device according to one embodiment.

FIG. 6 is a side view of the electronic device 301 and the accessory device 350 according to one embodiment.

Referring to FIG. 6, the electronic device 301 and the accessory device 350 may include various types of the coupling units 370. FIG. 6 is a diagram to describe various coupling units 370 in the electronic device 301 and the accessory device 350 of FIGS. 5A to 5D, and a repeated description thereof is omitted.

In one embodiment, the coupling unit 370 may include a plurality of coupling units 370 configured to connect the accessory device 350 to the electronic device 301 and support the accessory device 350 and the electronic device 301. The plurality of coupling units 370 may be formed of a magnetic body and may support the accessory device 350 and the electronic device 301 by using a magnetic force. However, the example is not limited thereto, and the plurality of coupling units 370 may be closely connected to each other through the shape and structure of the coupling unit 370.

For example, when the electronic device 301 is coupled to the accessory device 350, a pair of side surfaces 323d and 353d facing each other may have bent structures to correspond to each other. For example, the side surface 323d of the electronic device 301 may protrude in a direction (e.g., the −Y direction) and the side surface 353d of the accessory device 350 may recess in an opposite direction (e.g., the +Y direction) to be coupled to the side surface 323d of the electronic device 301. The pair of side surfaces 323d and 353d may face and couple to each other and may support the accessory device 350 and the electronic device 301. The pair of side surfaces 323d and 353d facing each other may be a pair of coupling units 370.

For example, as the second coupling unit 370b is arranged on one end of the mounting surface 390 and the second auxiliary coupling unit 371b is arranged on one end of the first housing 310 in the expansion direction, the second coupling unit 370b and the second auxiliary coupling unit 371b may maintain the electronic device 301 to be fixed to the accessory device 350 by applying mutual attraction or mutually fastening to each other.

Figure 7A:
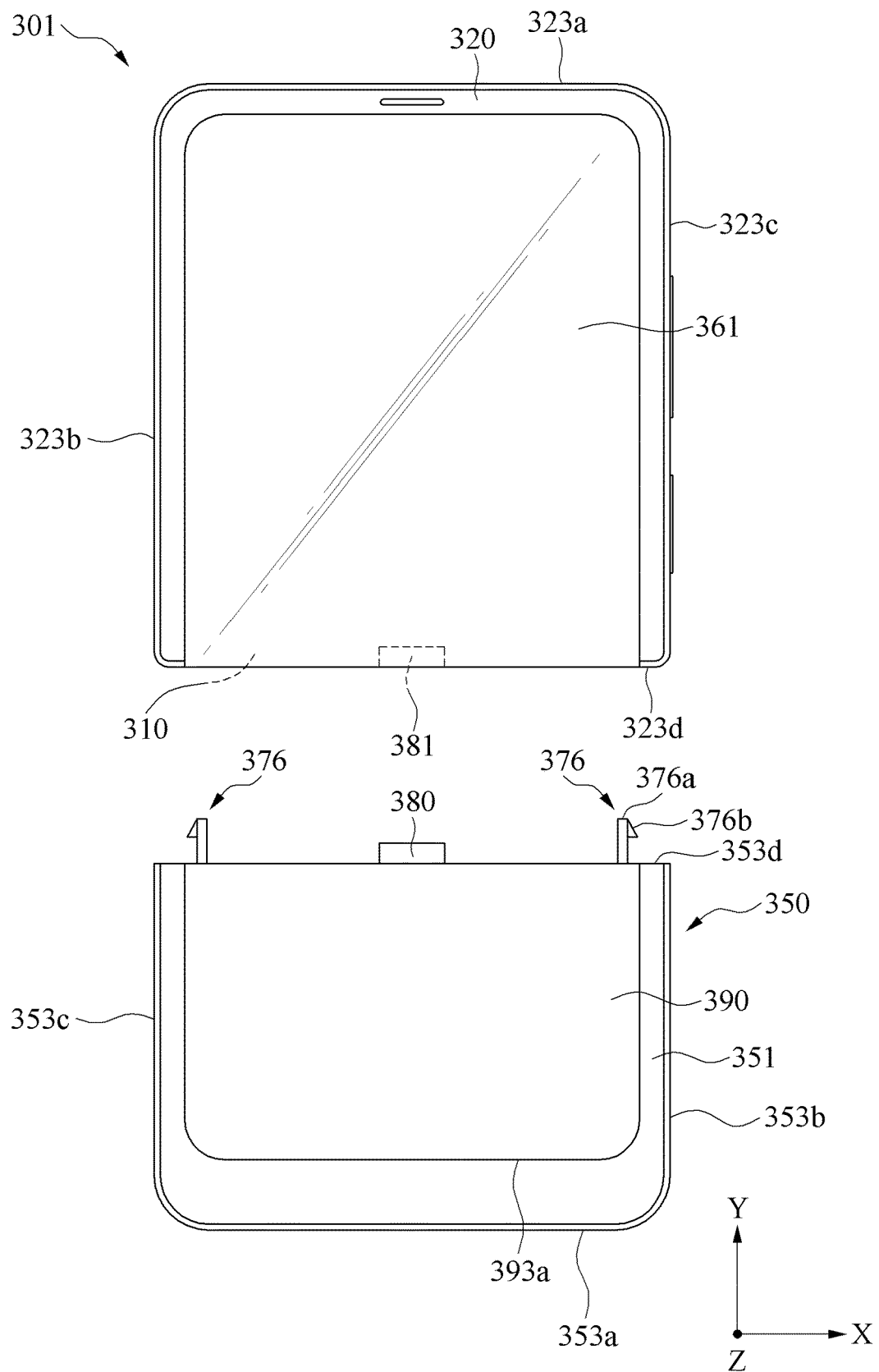
FIG. 7A is a side view of an electronic device and an accessory device according to one embodiment.
Figure 7B:
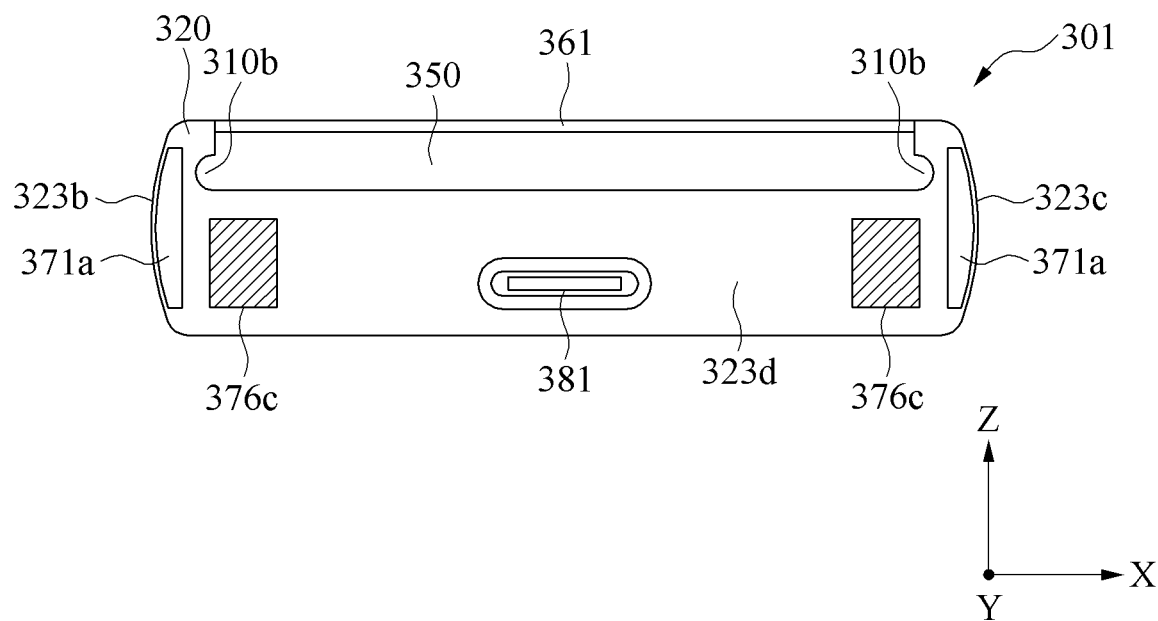
FIG. 7B is a side view of the electronic device according to one embodiment.
Figure 7C:
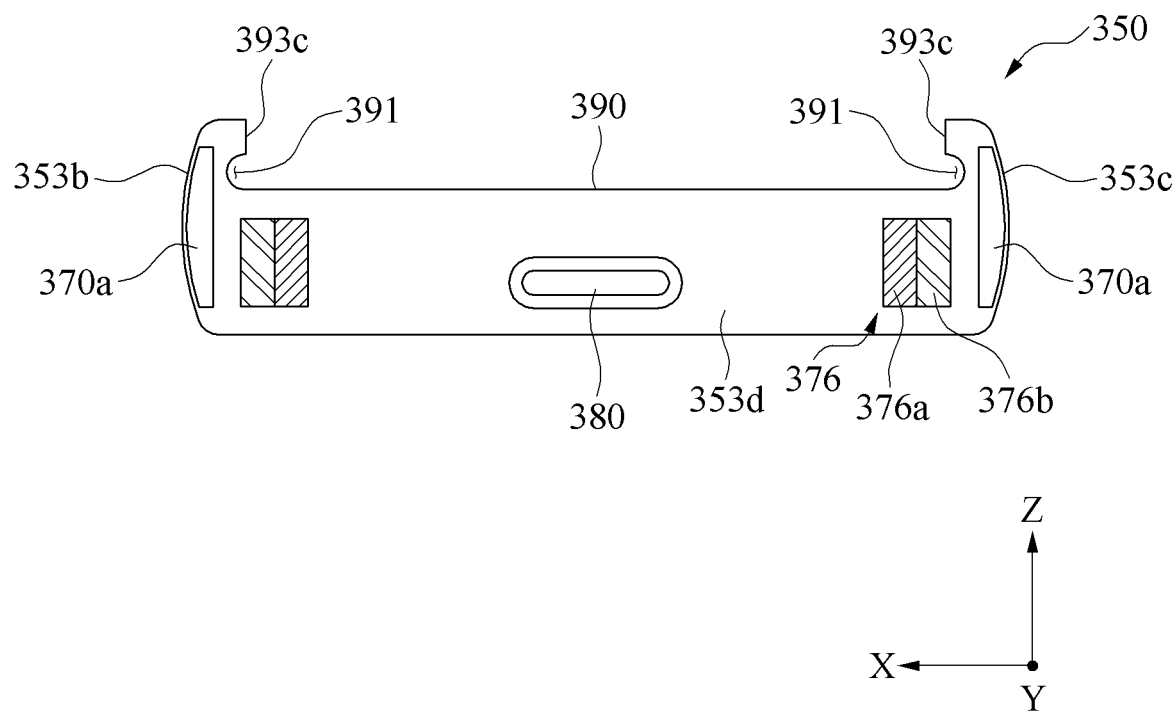
FIG. 7C is a side view of the accessory device according to one embodiment.

FIG. 7A is a side view of the electronic device 301 and the accessory device 350 according to one embodiment, FIG. 7B is a side view of the electronic device 301 according to one embodiment, and FIG. 7C is a side view of the accessory device 350 according to one embodiment.

Referring to FIGS. 7A to 7C, the accessory device 350 may include a hook 376 and the electronic device 301 may include a fastening groove 376c into which the hook 376 is inserted. FIGS. 7A to 7C are diagrams to describe various coupling units 370 and connecting units 380 of the electronic device 301 and the accessory device 350 of FIGS. 5A to 5D, and repeated descriptions thereof are omitted.

In one embodiment, the coupling unit 370 may be provided on the surface 353d contacting the housings 310 and 320 in the main body 351 and may include the hook 376 that is inserted into the housings 310 and 320. The hook 376 may include a pillar area 376a and a fastening area 376b and the electronic device 301 may include the fastening groove 376c into which the pillar area 376a and the fastening area 376b of the hook 376 are inserted. The hook 376 may be inserted into the fastening groove 376c and may be fixed and separated thereto and therefrom.

For example, when the hook 376 is inserted into the fastening groove 376c of the housings 310 and 320, the fastening area 376b may move inside the pillar area 376a and when the hook 376 is completely inserted into the fastening groove 376c, the fastening area 376b may move outside of the pillar area 376b and may fix the hook 376 to the fastening groove 376c. The user may control the fastening area 376b to move inside or outside the pillar area 376b by a separate control and may couple or separate the accessory device 350 to or from the electronic device 301.

For example, the fastening groove 376b may have a movable pressing structure to fix or separate the fastening area 376b and the user may couple or separate the accessory device 350 to or from the electronic device 301 to push the fastening area 376b by using the pressing structure of the fastening groove 376c.

In one embodiment, the electronic device 301 may include the auxiliary connecting unit 381 on the center of the surface 323d of the second housing 320 and the plurality of auxiliary coupling units 371 spaced apart from each other in both directions (e.g., the +/−X direction). The plurality of auxiliary coupling units 371 may be provided adjacent to the pair of side surfaces 323b and 323c of the second housing 320. The accessory device 350 may include the connecting unit 380 on the center of the surface 353d of the main body 351 and a plurality of coupling units 370 spaced apart from each other in both directions (e.g., the +/−X direction). The plurality of coupling units 370 may be provided adjacent to the pair of side surfaces 353b and 353c of the main body 351.

In one embodiment, the connecting unit 380 may include a terminal and may have an outwardly protruding structure, and the auxiliary connecting unit 381 may include a terminal groove to which the connecting unit 380 is fastened and may have an inwardly protruding structure. The plurality of coupling units 370 and the plurality of auxiliary coupling units 371 may be formed of a magnetic body and may generate an attractive force.

In one embodiment, the first housing 310 may include a first bent part 310b bent in both directions (e.g., the +/−X directions) perpendicular to the expansion direction from the center of the first housing 310. The accessory device 350 may include a second bent part 391 bent in both directions (e.g., the +/−X directions) corresponding to the first bent part 310b. The first bent part 310b and the second bent part 391 may guide to a moving path of the first housing 310 on the mounting surface 390 and may fix the first housing 310 to prevent the first housing 310 from escaping from the mounting space 390 in the coupled state. The first bent part 310b and the second bent part 391 may be one example of the pair of coupling units 370 and 371.

In one embodiment, the plurality of coupling units 370 and the plurality of auxiliary coupling units 371 may guide a coupling direction of the electronic device 301 and the accessory device 350. The connecting unit 380 and the auxiliary connecting unit 381 may couple and electrically connect the electronic device 301 to the accessory device 350. In the coupled state, the first bent part 310*b* and the second bent part 391 may guide to a moving path of the first housing 310 and may assist the first housing 310 to stably expand and to be fixed to the mounting surface 390.

In one embodiment, the electronic device 301 and the accessory device 350 of FIGS. 5A to 7C is to describe the coupling unit 370 and the connecting unit 380 in various embodiments. In the actual implementation, the example is not limited to the shown structure and location and may be implemented in various ways by transforming in a transformable range, omitting some structures, and adding or replacing other structures.

Figure 8A:
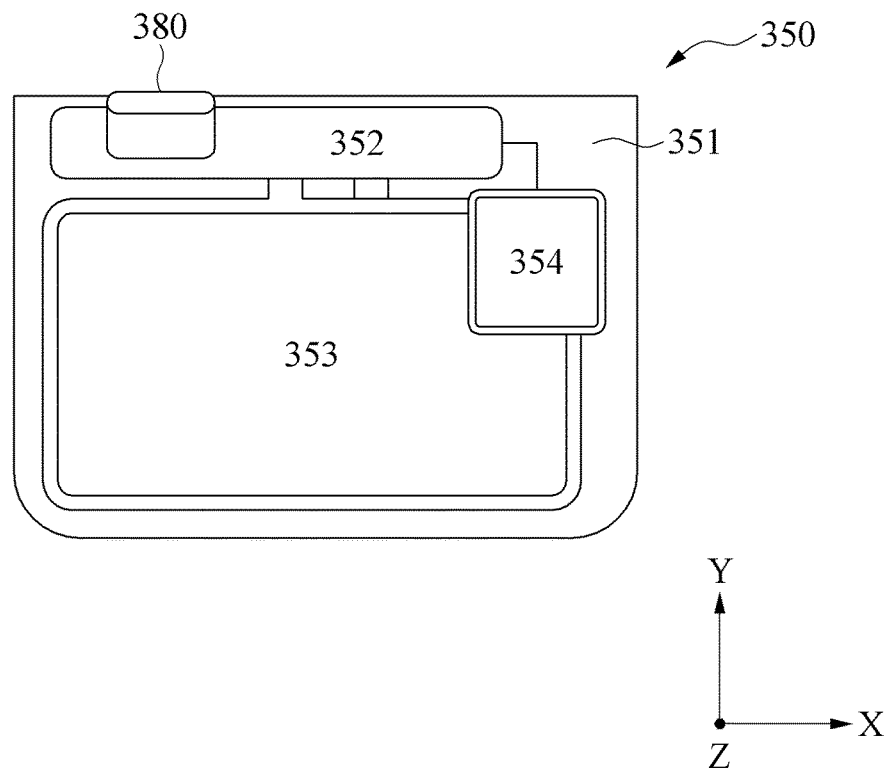
FIG. 8A is a diagram illustrating a configuration of an accessory device according to one embodiment.
Figure 8B:
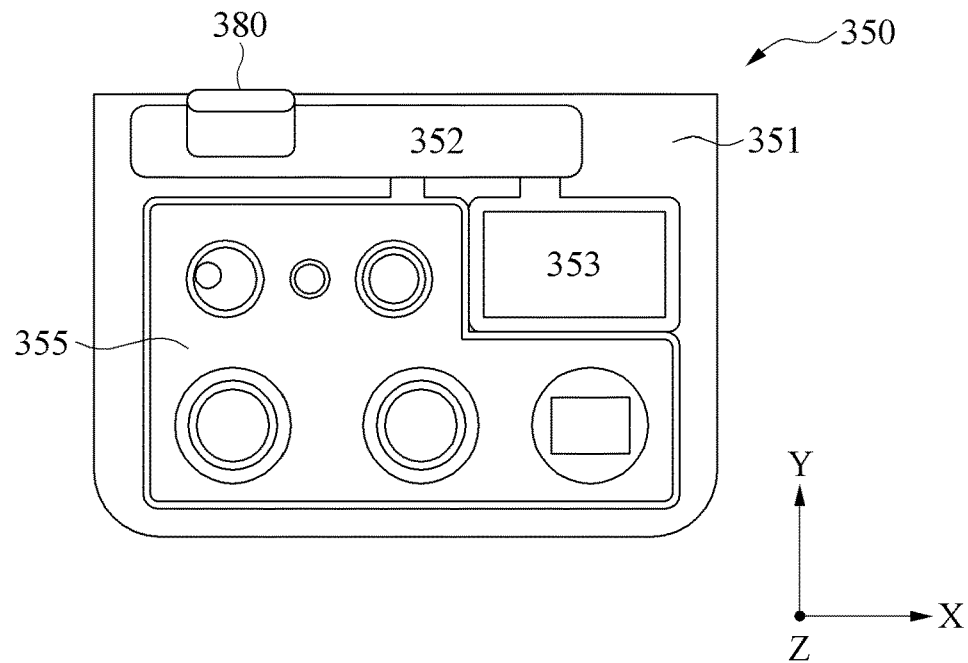
FIG. 8B is a diagram illustrating a configuration of the accessory device according to one embodiment.
Figure 8C:
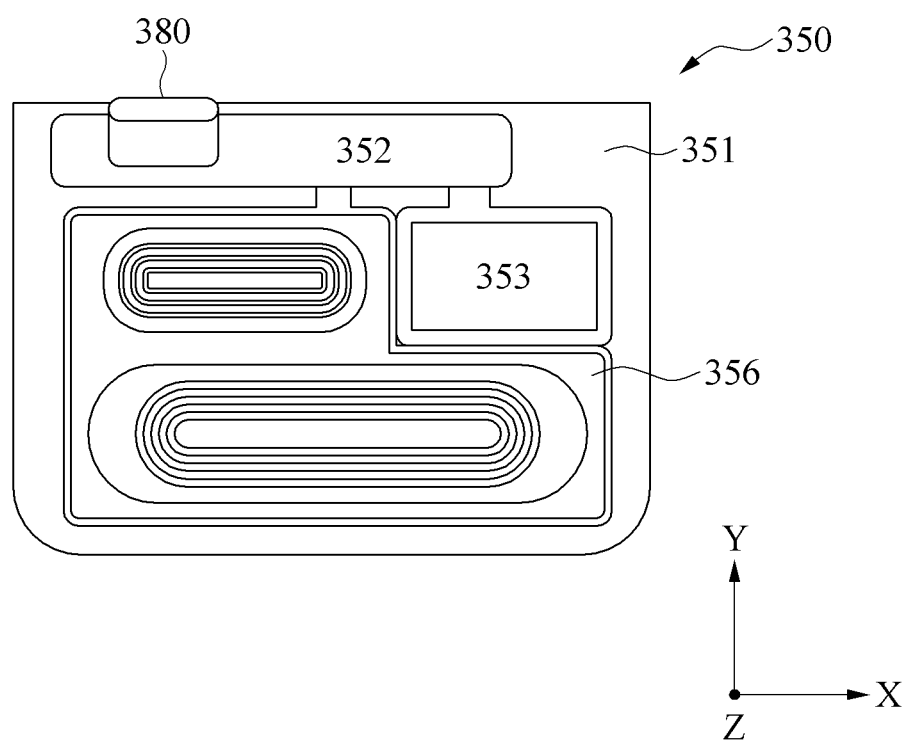
FIG. 8C is a diagram illustrating a configuration of the accessory device according to one embodiment.

FIG. 8A is a diagram illustrating a configuration of the accessory device 350 according to one embodiment, FIG. 8B is a diagram illustrating a configuration of the accessory device 350 according to one embodiment, and FIG. 8C is a diagram illustrating a configuration of the accessory device 350 according to one embodiment.

Referring to FIGS. 8A to 8C, the accessory device 350 may include at least one of a battery module 353, a memory module 354, an input module 355, and an output module 356.

In one embodiment, the accessory device 350 may be arranged inside the main body 351 and may include a controller 352 configured to control driving of the accessory device 350. The controller 352 may be connected to the connecting unit 380 and may be connected to the electronic device 301 through the connecting unit 380. The controller 352 may detect the connection to the electronic device 301 and may transmit/receive an electrical signal to/from the electronic device 301.

In one embodiment, the accessory device 350 may include the battery module 353. The battery module 353 may supply power to drive the accessory device 350 or may function as an auxiliary battery configured to supply power to drive the electronic device 301. The electronic device 301 may need to secure a space for a battery (e.g., the battery 189 of FIG. 1) to be miniaturized and driven with high performance, simultaneously. The accessory device 350 may assist the battery 189 of the electronic device 301 to supply power to the electronic device 301 and may function as the auxiliary battery to drive the electronic device 301. The accessory device 350 may decrease a space of the battery 189 in the internal structure design of the electronic device 301 through the battery module 353 configured to function as the auxiliary battery and may help the electronic device 301 to be miniaturized and improve the performance of the electronic device 301.

In one embodiment, the battery module 353 may be charged by being connected to an external power supply device (not shown) through the connecting unit 380 of the accessory device 350 or a separate charging terminal (not shown). Alternatively, the battery module 353 may be charged together with the battery of the electronic device 301 when the electronic device 301 is connected to the external power supply device (not shown) while the battery module 353 is connected to the electronic device 301.

In one embodiment, as shown in FIG. 8A, the accessory device 350 may include the memory module 354. The memory module 354 may be a memory device to drive the accessory device 350 or may function as an auxiliary memory configured to store data to drive the electronic device 301 and provide the data to the electronic device 301. The memory module 354 may be connected to the controller 352, and the controller 352 may be connected to a processor (e.g., the processor 120 of FIG. 1) through the connecting unit 380 and may transmit or receive data to or from the electronic device 301.

In one embodiment, as shown in FIG. 8B, the accessory device 350 may include the input module 355. The input module 355 may receive a signal from the outside and may transmit an input signal to the electronic device 301. For example, the input module 355 may be a high performance camera module. The electronic device 301 may require a relatively large lens and a sensor to provide a high performance camera function, and thus, may have an external figure in which a camera protrudes from the housings 310 and 320 of the electronic device 301 and a space occupied by the camera module (e.g., the camera module 180 of FIG. 1) in the electronic device 301 may increase. The accessory device 350 may assist the camera module of the electronic device 301 to provide the high performance camera function to the electronic device 301, may decrease a space of the camera module 180 in the internal structure design of the electronic device 301, and may help the electronic device 301 to be miniaturized and improve the performance of the electronic device 301.

In one embodiment, the input module 355 may be implemented as various input devices other than the camera module. For example, the input module 355 may be a sensor module or an input device configured to control driving of the electronic device 301, such as a physical keyboard or a touch pad.

In one embodiment, as shown in FIG. 8C, the accessory device 350 may include the output module 356. The output module 356 may output an output signal received from the electronic device 301 to the outside. For example, the output module 356 may be a sound output module with a high performance speaker function. The electronic device 301 may require a relatively large diaphragm or a resonant space to provide the high performance speaker function, and thus, a space occupied by the sound output module (e.g., the sound output module 155 of FIG. 1) in the electronic device 301 may increase. The accessory device 350 may assist the sound output module 155 of the electronic device 301 to provide the high performance speaker function to the electronic device 301, may decrease a space of the sound output module 155 in the internal structure design of the electronic device 301, and may help the electronic device 301 to be miniaturized and improve the performance of the electronic device 301.

In one embodiment, the output module 356 may be implemented as various input devices other than the speaker module. For example, the output module 356 may be a module device including a sub-display module configured to assist a display module (e.g., the display module 160 of FIG. 1) of the electronic device 301. Alternatively, the output module 356 may be wireless earphones and the accessory device 350 may be a case to charge the wireless earphones and protect the wireless earphones to be easily carried.

Figure 9A:
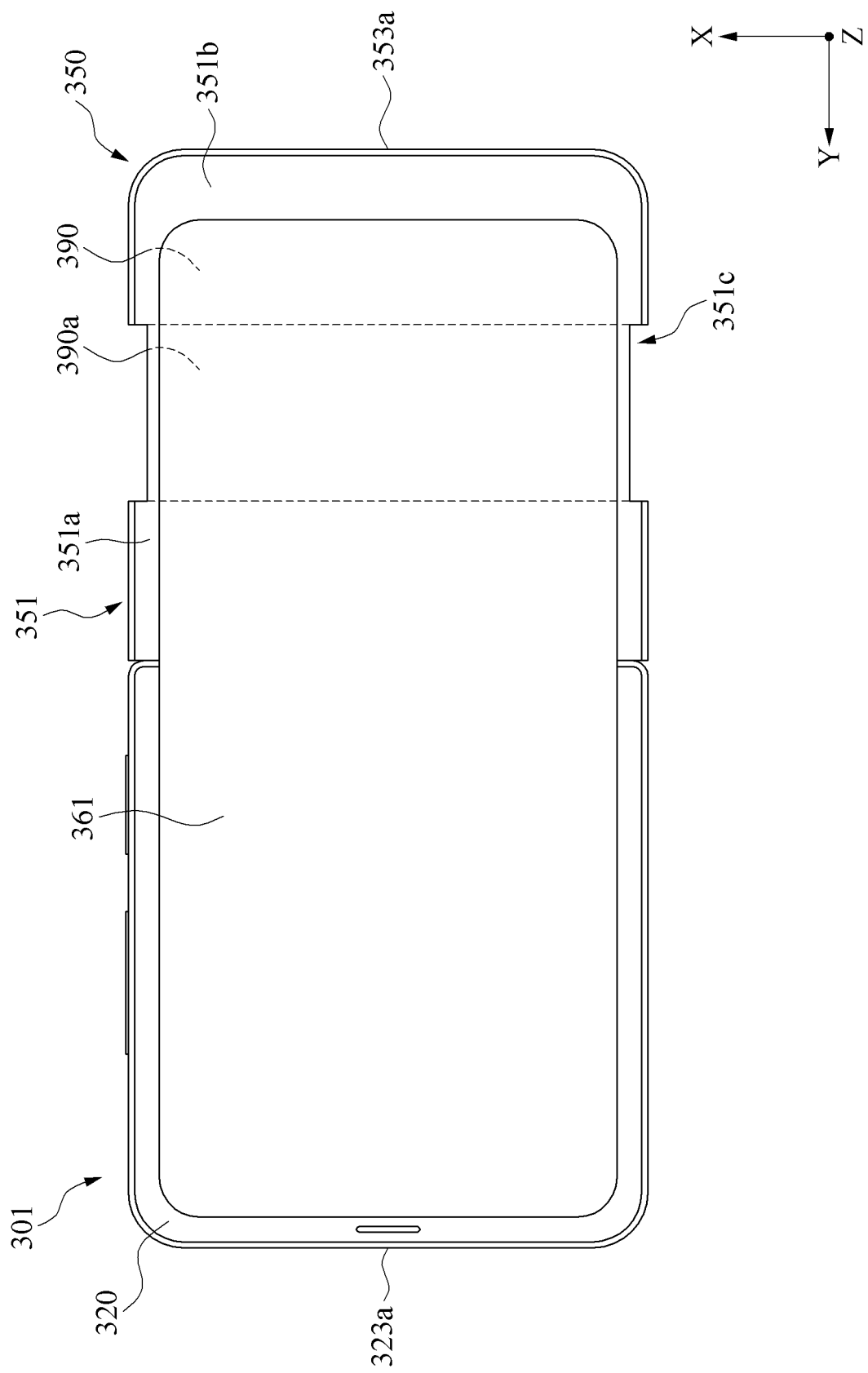
FIG. 9A is a front view of an electronic device and an accessory device according to one embodiment.
Figure 9B:
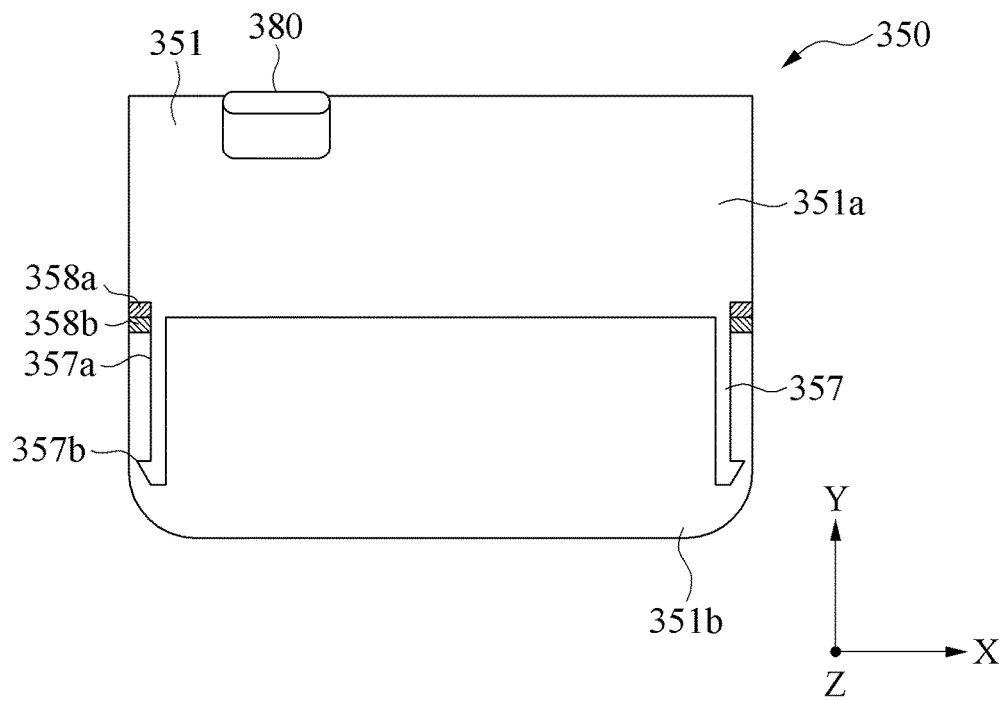
FIG. 9B is a front view of the accessory device according to one embodiment.
Figure 9C:
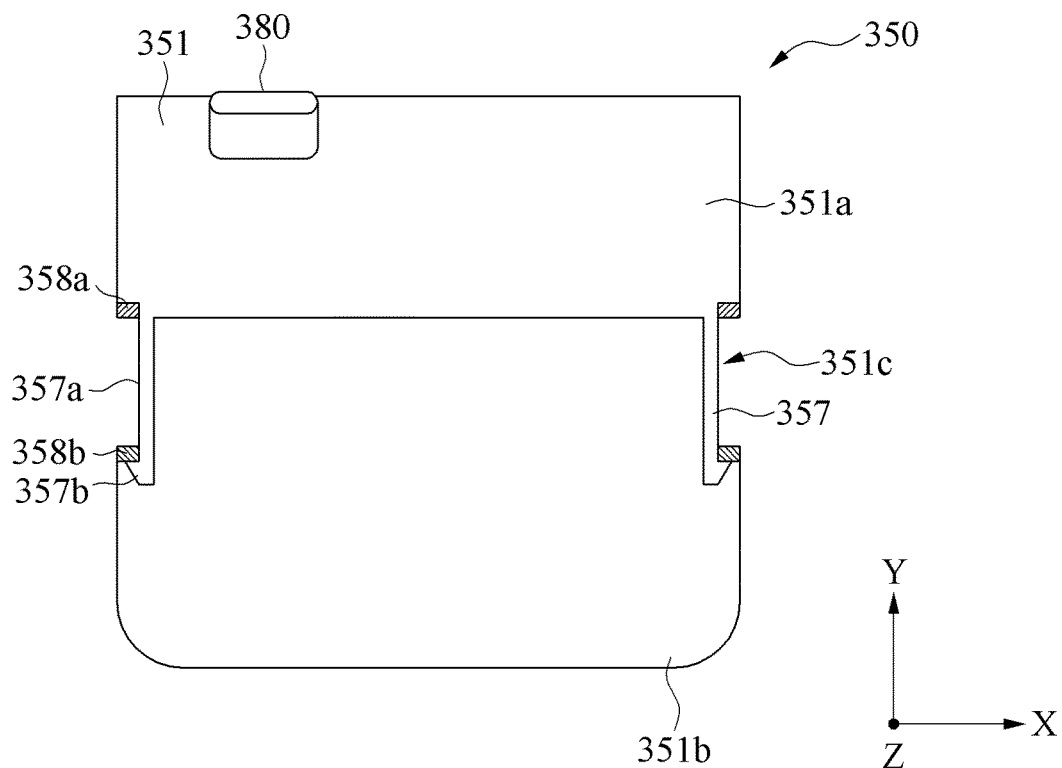
FIG. 9C is a front view of the accessory device according to one embodiment.

FIG. 9A is a front view of the electronic device 301 and the accessory device 350 according to one embodiment, FIG. 9B is a front view of the accessory device 350 according to one embodiment, and FIG. 9C is a front view of the accessory device 350 according to one embodiment.

Referring to FIGS. 9A to 9C, the accessory device 350 may include a first body 351*a* and a second body 351*b*. To describe FIGS. 9A to 9C, a repeated description thereof is omitted.

In one embodiment, the main body 351 may include the first body 351*a* coupled to the housings 310 and 320 and the second body 351*b* configured to be movable in the expansion direction (e.g., the −Y direction) and the retraction direction (e.g., the +Y direction) in which the housings 310 and 320 are moveable relative to the first body 351a. The first body 351a may face the second housing 320 of the electronic device 301, and the second body 351b may be arranged in a direction opposite to the electronic device 301 based on the first body 351a.

In one embodiment, the mounting surface 390 may be provided at the first body 351a and the second body 351b and may expand or retract in interoperation with expansion and reduction of the main body 351 as the second body 351b moves. As the second body 351b moves in the expansion direction and the retraction direction, the main body 351 may expand or retract.

In one embodiment, when the second body 351b is moved, the main body 351 may include an auxiliary expanded area 351c added in the expansion direction and the mounting surface 390 may include an expanded mounting area 390a corresponding to the auxiliary expanded area 351c provided by expansion of the main body 351.

In one embodiment, the first housing 310 of the electronic device 301 may move according to the expansion state of the main body 351, and the display module 361 may expand in interoperation with the first housing 310. That is, the second body may be expandable and retractable, together with expansion and retraction of the housing of the electronic device, and the second body which is expanded together with the housing defines the mounting surface by a surface of the first body together with a surface of the second body. As the main body 351 expands, the display module 361 may expand by the expanded mounting area 390a of the mounting surface 390 and screen display areas of the electronic device 301 and the accessory device 350 may increase. The main body 351, which is expandable, may decrease the volume of the accessory device 350 when separated from the electronic device 301, and may improve portability of the accessory device 350.

In one embodiment, the first body 351a may include an expansion member 357 including a rail 357a extending in a second body 351b direction (e.g., the −Y direction) and a bump 357b configured to limit expansion of the first body 351a and the second body 351b may move in interoperation with the rail 357a and may expand or retract the main body 351.

In one embodiment, the accessory device 350 may include expansion sensors 358a and 358b configured to sense a moving state of the second body 351b. For example, the expansion sensors 358a and 358b may include the first sensor 358a on the first body 351a and the second sensor 358b on the second body 351b, respectively. The first sensor 358a and the second sensor 358b may face each other and may sense a distance between the first body 351a and the second body 351b as the first body 351a and the second body 351b move, and the accessory device 350 may sense the expansion state of the accessory device 350 based on a distance between the first sensor 358a and the second sensor 358b. For example, the expansion sensors 358a and 358b may be an optical sensor or a magnetic sensor.

Figure 10A:
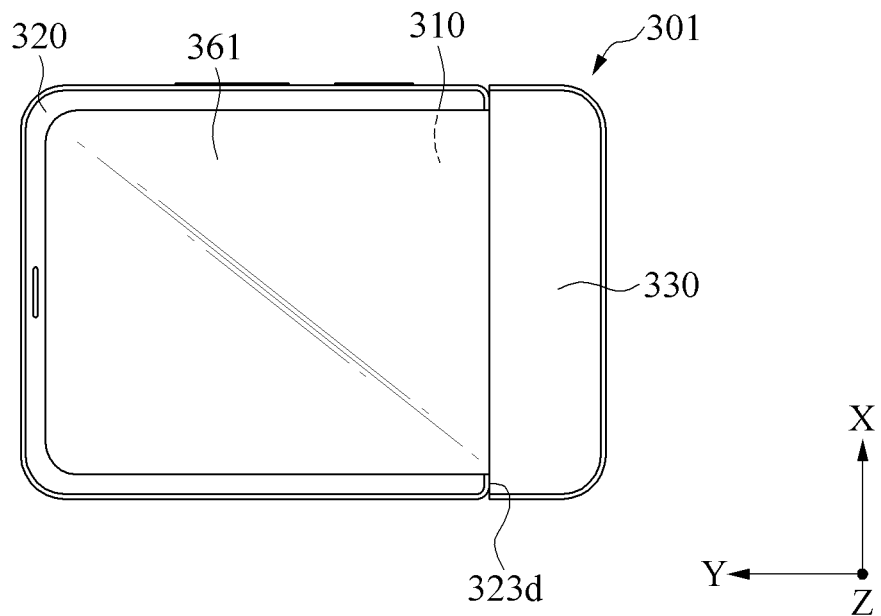
FIG. 10A is a front view of an electronic device according to one embodiment.
Figure 10B:
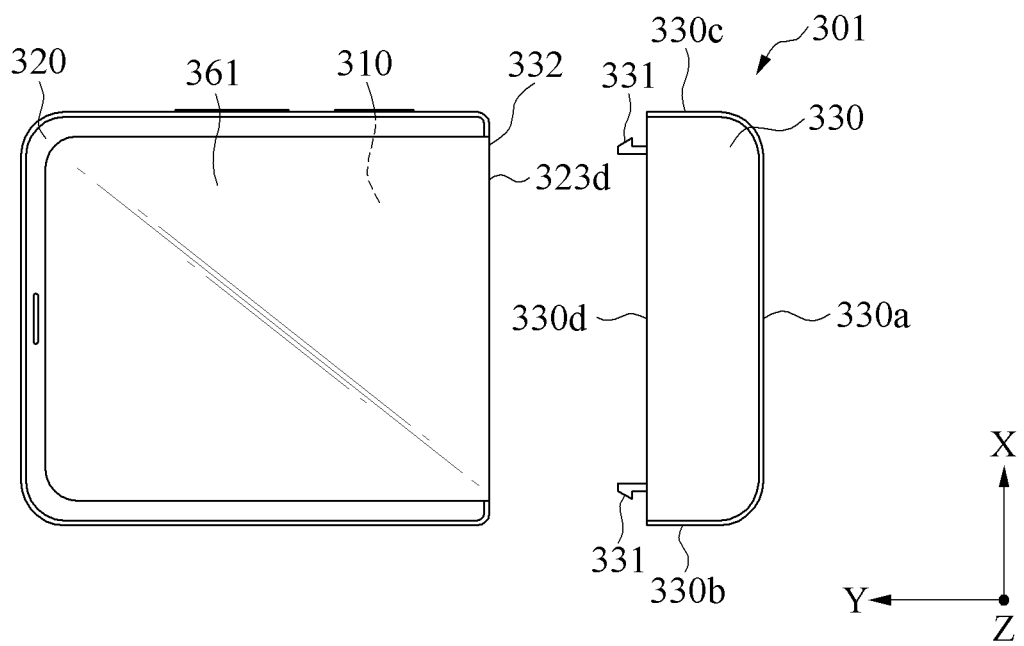
FIG. 10B is a front view of the electronic device according to one embodiment.
Figure 10C:
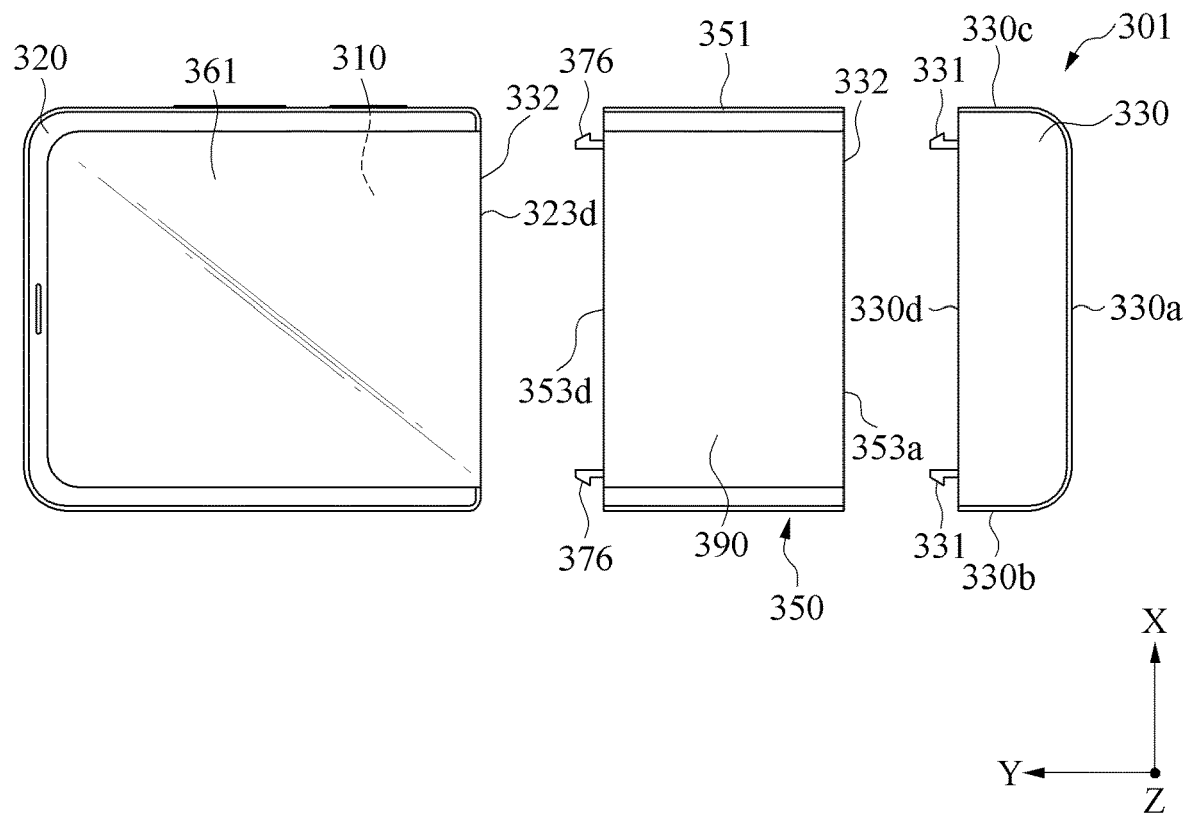
FIG. 10C is a front view of the electronic device and an accessory device according to one embodiment.
Figure 10D:
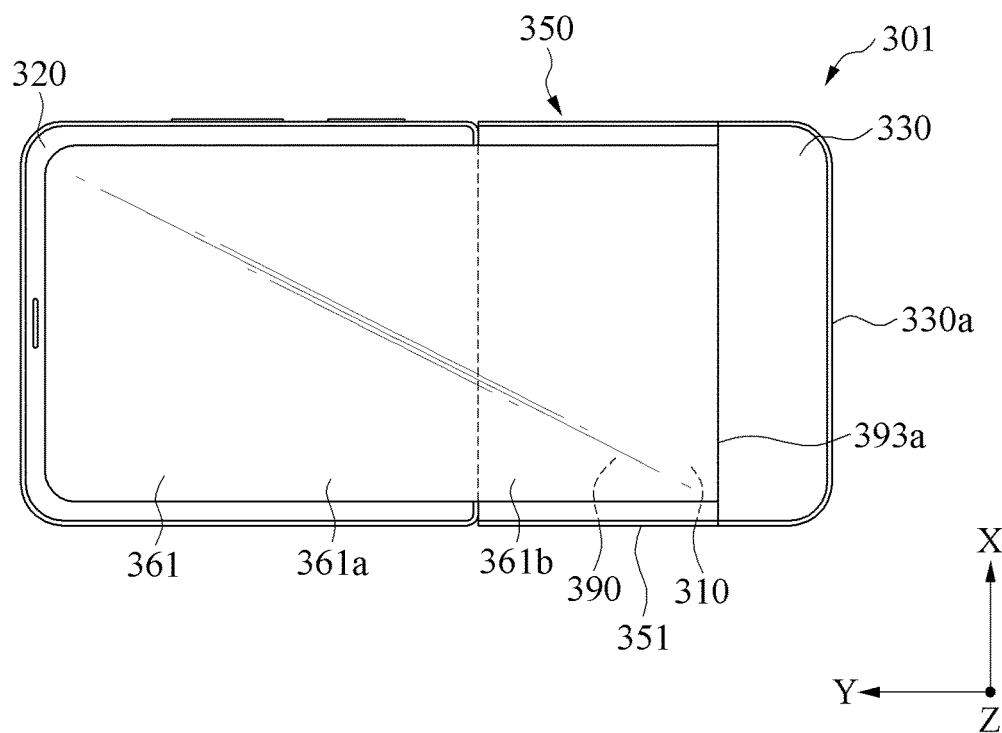
FIG. 10D is a front view of the electronic device and the accessory device according to one embodiment.

FIG. 10A is a front view of the electronic device 301 according to one embodiment, FIG. 10B is a front view of the electronic device 301 according to one embodiment, FIG. 10C is a front view of the electronic device 301 and the accessory device 350 according to one embodiment, and FIG. 10D is a front view of the electronic device 301 and the accessory device 350 according to one embodiment.

Referring to FIGS. 10A to 10D, the electronic device 301 may include the side cover 330 detachable from the electronic device 301 and/or the accessory device 350.

In one embodiment, as shown in FIGS. 10A and 10B, the side cover 330 may be coupled to the surface 323d of the electronic device 301, such as being directly coupled to the electronic device 301, without being limited thereto. The side cover 330 may be coupled to or separated from the side surface 323d of the electronic device 301 in the expansion direction (e.g., the −Y direction).

In one embodiment, the side cover 330 may include a surface 330a facing the expansion direction, side surfaces 330b and 330c extending from the surface 330a to both ends, respectively, and a surface 330d extending from the side surfaces 330b and 330c and facing the electronic device 301. The side cover 330 may include a first fixing member 331 protruding from the surface 330d and the housings 310 and 320 may include a fixing groove 332 provided in the surface 323d to insert the first fixing member 331 therein.

In one embodiment, the side cover 330 may be coupled to the second housing 320 when the electronic device 301 is in the retracted state, and the user may separate the side cover 330 from the electronic device 301 by an operation before expanding the electronic device 301.

In one embodiment, as shown in FIGS. 10C and 10D, the accessory device 350 may be coupled to the surface 323d of the electronic device 301, such as being directly coupled thereto, and the side cover 330 may be coupled to the surface 353a of the accessory device 350. That is the side cover 330 may be indirectly coupled to the main electronic device (e.g., the electronic device 301) by the accessory device 350 as an intervening member. The accessory device 350 and the side cover 330 may be coupled to or separated from the electronic device 301 and the side surfaces 323d and 353a of the accessory device 350 in the expansion direction (e.g., the −Y direction), respectively.

In one embodiment, the accessory device 350 may include a second fixing member 376 (e.g., hook 376 in FIGS. 7A to 7C) protruding from the surface 353d facing the electronic device 301, and the accessory device 350 may include a fixing groove 332 provided in the surface 353a facing the side cover 330 to insert the first fixing member 331 therein.

In one embodiment, the electronic device 301 may be coupled to the accessory device 350, the accessory device 350 may be coupled to the side cover 330, and the first housing 310 and the display module 361 may move from the top of the mounting surface 390 to a region adjacent to the side cover 330.

For example, when the accessory device 350 is coupled to the side cover 330, the first housing 310 may contact or substantially overlap with the surface 330d of an end (e.g., the first inner side surface 393a) of the mounting surface 390 and the first housing 310 may expand to the end (e.g., the first inner side surface 393a) of the mounting surface 390. The screen display area of the display module 361 may expand from the partial region 361a before expansion to the expanded area 361b.

In one embodiment, the side cover 330, which is selectively attachable to the electronic device 301 and the accessory device 350, may reduce the volume of the accessory device 350 when accessory device 350 is separated from the electronic device 301 and may improve portability of the accessory device 350. In addition, when the accessory device 350 is separated from the electronic device 301, the side cover 330 may protect the auxiliary coupling unit 371 and the auxiliary connecting unit 381 of the electronic device 301 from being exposed to the outside and may prevent water or a foreign material from entering the inside of the electronic device 301.

In one embodiment, the accessory device 350 attachable to the electronic device 301 including the housings 310 and 320, which are expandable, and the display module 361 expanding in interoperation with the housings 310 and 320 may include the main body 351 including the mounting surface 390 configured to mount an expanded area of the housings 310 and 320 and support the expanded area 361*b* of the display module 361 and the coupling unit 370 detachably coupling the main body 351 to the housings 310 and 320.

In one embodiment, the coupling unit 370 may include a magnetic body provided in a region contacting the housings 310 and 320 in the main body 351 and configured to electrically and mutually interact with the housings 310 and 320.

In one embodiment, the coupling unit 370 may include the hook 376 provided in the region contacting the housings 310 and 320 in the main body 351 and inserted into the housings 310 and 320.

In one embodiment, the coupling unit 370 may include the coupling groove 375*a* provided adjacent to the mounting surface 390 of the main body 351 and have the shape corresponding to the shape of the expanded area of the housings 310 and 320.

In one embodiment, the coupling unit 370 may include the first coupling unit 370*a* provided on the end of the main body 351 and configured to support the main body 351 when coupled to the housings 310 and 320 and the second coupling unit 370*b* coupled to the expanded area of the housings 310 and 320 in the main body 351.

In one embodiment, the accessory device 350 may include the connecting unit 380 configured to electrically connect the electronic device 301 to the accessory device 350.

In one embodiment, the connecting unit 380 may include the connecting terminal connected to the electronic device 301 and configured to transmit/receive at least one of an electrical signal and power.

In one embodiment, the connecting unit 380 may include a wireless connection module wirelessly connected to the electronic device 301 and configured to transmit/receive at least one of an electrical signal and power.

In one embodiment, the accessory device 350 may include the battery module 353 configured to charge the electronic device 301 with power when connected to the electronic device 301.

In one embodiment, the accessory device 350 may include the memory module 354 configured to store data and the controller 352 configured to transmit data from the memory module 354 to the electronic device 301.

In one embodiment, the accessory device 350 may include the input module 355 configured to transmit an input signal to the electronic device 301.

In one embodiment, the accessory device 350 may include the output module 356 configured to receive an output signal from the electronic device 301 and output the output signal to the outside.

In one embodiment, the main body 351 may include the first body 351*a* coupled to the housings 310 and 320 and the second body 351*b* moving in the expansion direction and the retraction direction of the housings 310 and 320 from the first body 351*a*.

In one embodiment, the mounting surface 390 may be provided at the first body 351*a* and the second body 351*b* and may expand or retract in interoperation with expansion and reduction of the main body 351 as the second body 351*b* moves.

In one embodiment, the accessory device 350 may include the expansion sensors 358*a* and 358*b* configured to sense the moving state of the second body 351*b* and the controller 352 configured to transmit the expansion state of the main body 351 to the electronic device 301 by receiving a sensing result from the expansion sensors 358*a* and 358*b*.

In one embodiment, the electronic device 301 may include the first housing 310 and the second housing 320 where the first housing 310 is configured to move relative to the second housing 320 in the expansion direction and the retraction direction, the display module 361 supported by the first housing 310 and configured to expand and retract a screen display area in interoperation with movement of the first housing 310, the auxiliary coupling unit 371 provided on a surface of the housings 310 and 320 in the expansion direction, and the accessory device 350 detachably attached to the housings 310 and 320 and configured to support the housings 310 and 320 when the housings 310 and 320 are in an expanded state, where the accessory device 350 may include the main body 351 including the mounting surface 390 configured to mount an expanded area of the first housing 310 and support the expanded area 361*b* of the display module 361, and the coupling unit 370 configured to detachably couple the main body 351 to the housings 310 and 320.

In one embodiment, the first housing 310 may include the bracket 375*b* provided on a surface facing the mounting surface 390, and the coupling unit 370 may include the coupling groove 375*a* provided adjacent to the mounting surface 390 of the main body and including a shape corresponding to a shape of the bracket 375*b*.

In one embodiment, the coupling unit 370 may include the first coupling unit 370*a* provided at one end contacting the second housing 320 in the main body 351 and coupled to the second housing 320, and the second coupling unit 370*b* coupled to the first housing 310 in the main body 351 when the first housing 310 is in the expanded state.

In one embodiment, the accessory device 350 may include the connecting unit 380 configured to electrically connect the electronic device 301 to the accessory device 350.

In one embodiment, the main body 351 may include the first body 351*a* coupled to the second housing 320, and the second body 351*b* moving in the expansion direction and the retraction direction from the first body 351*a*.

In one embodiment, an accessory device detachably attachable to an electronic device comprising a housing which is expandable to define an expanded area of the housing, and a display module which is expandable, together with the housing, to define an expanded area of the display module, and the accessory device may comprise a main body configured to be mounted to the expanded area of the housing, the main body comprising a mounting surface, and a coupling unit which detachably attaches the accessory device to the electronic device, wherein the main body which is attached to the housing which is expanded, may disposes the mounting surface to support the expanded area of the housing together with the expanded area of the display module.

In one embodiment, the coupling unit may comprise a magnetic body which is connected to the main body and electromagnetically interacts with the housing. In one embodiment, the accessory device which is attached to the electronic device may dispose the magnetic body to contact with the housing.

In one embodiment, the coupling unit may comprise a hook which is connected to the main body and is insertable into the housing. In one embodiment, the accessory device which is attached to the electronic device may dispose the hook to be inserted into the housing and to contact with the housing.

In one embodiment, the coupling unit may comprise a coupling groove which is provided in the main body with adjacent to the mounting surface and has a shape corresponding to a shape of the expanded area of the housing. In one embodiment, the accessory device which is attached to the electronic device may disposes the coupling groove of the main body coupling the expanded area of the housing.

In one embodiment, the coupling unit may comprise a first coupling unit connected to one end of the main body which is close to the housing, and a second coupling unit connected to the other end of the main body which is opposite to the one end. In one embodiment, the accessory device which is attached to the electronic device may dispose the first coupling unit to contact with a non-expanded area of the housing, and the second coupling unit to contact with the expanded area of the housing.

In one embodiment, an accessory device may further comprise a connecting unit configured to electrically connect the electronic device to the accessory device.

In one embodiment, the connecting unit may comprise a connecting terminal connected to the electronic device and configured to transmit or receive at least one of an electrical signal and power.

In one embodiment, the connecting unit may comprise a wireless connection module wirelessly connected to the electronic device and configured to transmit or receive at least one of an electrical signal and power.

In one embodiment, an accessory device may further comprise a battery module configured to provide power to the electronic device when the accessory device is connected to the electronic device.

In one embodiment, an accessory device may further comprise a memory module configured to store data and a controller configured to transmit the data from the memory module to the electronic device.

In one embodiment, an accessory device may further an input module configured to transmit an input signal to the electronic device.

In one embodiment, an accessory device may further an output module configured to receive an output signal from the electronic device and output the output signal to outside the accessory device.

In one embodiment, the housing of the electronic device may be expandable in an expansion direction and is retractable in a retraction direction. In one embodiment, the main body may comprise a first body detachably attached to the housing, and a second body moveable along the expansion direction or the retraction direction relative to the first body.

In one embodiment, the second body is expandable and retractable, together with expansion and retraction of the housing of the electronic device, and the mounting surface is provided at the first body and the second body and configured to expand or retract together with the second body.

In one embodiment, an accessory device may further an expansion sensor configured to sense a moving state of the second body, and a controller which is connected to the expansion sensor, configured to receive the moving state of the second body from the expansion sensor and transmit the moving state of the second body, to the electronic device.

In one embodiment, an electronic device may comprise a housing comprising a first housing which is moveable relative to a second housing, in an expansion direction away from the second housing to define an expanded area of the first housing and in a retraction direction toward the second housing, a display module connected to the housing, the display module extendable in the expansion direction to define an expanded area of the display module, and retractable in the retraction direction, together with the first housing, and an accessory device detachably attachable to the housing. In one embodiment, the accessory device may comprise a main body configured to be mounted to the expanded area of the housing, the main body comprising a mounting surface which is extended along the expansion direction, and a coupling unit which detachably attaches the main body to the housing. In one embodiment, the main body which is attached to the housing which is expanded, may disposes the mounting surface to support the expanded area of the display module together with the expanded area of the first housing.

In one embodiment, the first housing may comprise a bracket moveable along the expansion direction. In one embodiment, the coupling unit may comprise a coupling groove which is provided in the main body with adjacent to the mounting surface and has a shape corresponding to a shape of the bracket, and the accessory device which is attached to the housing and the display module which are expanded may disposes the bracket moved along the expansion direction, into the coupling groove and facing the mounting surface.

In one embodiment, the coupling unit may comprise a first coupling unit provided at one end of the main body which is close to the housing, and a second coupling unit provided at the other end of the main body which is opposite to the one end. In one embodiment, the accessory device which is attached to the electronic device and the display module which are expanded may disposes the first coupling unit coupled to the housing at the second housing, and the second coupling unit coupled to the housing at the expanded area of the first housing.

In one embodiment, the accessory device further may comprise a connecting unit configured to electrically connect the electronic device to the accessory device.

In one embodiment, the main body may comprise a first body detachably attached to the housing, and a second body moveable along the expansion direction and the retraction direction, relative to the first body.

Although the description is provided based on embodiments, present disclosure is not limited to the above shown and described embodiments. Various embodiments with modifications by one of ordinary skill in the art within the scope of the claims may be possible and the modified embodiments may be not separately construed from the technical idea or aspect.

What is claimed is:

1. An accessory device detachably attachable to an electronic device comprising a housing which is moveably expandable to define an expanded area of the housing, and a display module which is moveably expandable, together with the housing, to define an expanded area of the display module, and the accessory device comprising:
    a main body configured to be mounted to the expanded area of the housing, the main body comprising a mounting surface; and a coupling unit which detachably attaches the accessory device to the electronic device;
wherein the main body which is attached to the housing which is expanded, disposes the mounting surface to support the expanded area of the housing together with the expanded area of the display module.

2. The accessory device of claim 1,
wherein the coupling unit comprises a magnetic body which is connected to the main body and electromagnetically interacts with the housing, and
wherein the accessory device which is attached to the electronic device disposes the magnetic body in contact with the housing.

3. The accessory device of claim 1,
wherein the coupling unit comprises a hook which is connected to the main body and is insertable into the housing, and
wherein the accessory device which is attached to the electronic device disposes the hook inserted into the housing and to contact with the housing.

4. The accessory device of claim 1,
wherein the coupling unit comprises a coupling groove which is provided in the main body, adjacent to the mounting surface, and has a shape corresponding to a shape of the expanded area of the housing,
wherein the accessory device which is attached to the electronic device disposes the coupling groove of the main body coupled to the expanded area of the housing.

5. The accessory device of claim 1,
wherein the coupling unit comprises:
a first coupling unit connected to one end of the main body which is close to the housing, and
a second coupling unit connected to the other end of the main body which is opposite to the one end, and
wherein the accessory device which is attached to the electronic device disposes:
the first coupling unit to contact with a non-expanded area of the housing, and
the second coupling unit to contact with the expanded area of the housing.

6. The accessory device of claim 1, further comprising:
a connecting unit configured to electrically connect the electronic device to the accessory device.

7. The accessory device of claim 6, wherein the connecting unit comprises a connecting terminal connected to the electronic device and configured to transmit or receive at least one of an electrical signal and power.

8. The accessory device of claim 6, wherein the connecting unit comprises a wireless connection module wirelessly connected to the electronic device and configured to transmit or receive at least one of an electrical signal and power.

9. The accessory device of claim 1, further comprising:
a battery module configured to provide power to the electronic device when the accessory device is connected to the electronic device.

10. The accessory device of claim 1, further comprising:
a memory module configured to store data and a controller configured to transmit the data from the memory module to the electronic device.

11. The accessory device of claim 1, further comprising:
an input module configured to transmit an input signal to the electronic device.

12. The accessory device of claim 1, further comprising:
an output module configured to receive an output signal from the electronic device and output the output signal to outside the accessory device.

13. The accessory device of claim 1, wherein
the housing of the electronic device is expandable in an expansion direction and is retractable in a retraction direction, and
the main body comprises:
a first body detachably attached to the housing, and
a second body moveable along the expansion direction or the retraction direction relative to the first body.

14. The accessory device of claim 13, wherein
the second body is expandable and retractable, together with expansion and retraction of the housing of the electronic device, and
the mounting surface is provided at the first body and the second body and configured to expand or retract together with the second body.

15. The accessory device of claim 13, comprising:
an expansion sensor configured to sense a moving state of the second body; and
a controller which is connected to the expansion sensor, configured to receive the moving state of the second body from the expansion sensor and transmit the moving state of the second body, to the electronic device.

16. An electronic device comprising:
a housing comprising a first housing which is moveably expandable relative to a second housing, in an expansion direction away from the second housing to define an expanded area of the first housing and moveably retractable in a retraction direction toward the second housing;
a display module connected to the housing, the display module moveably extendable in the expansion direction to define an expanded area of the display module, and moveably retractable in the retraction direction, together with the first housing; and
an accessory device detachably attachable to the housing;
wherein the accessory device comprises:
a main body configured to be mounted to the expanded area of the housing, the main body comprising a mounting surface which is extended along the expansion direction, and
a coupling unit which detachably attaches the main body to the housing,
wherein the main body which is attached to the housing which is expanded, disposes the mounting surface to support the expanded area of the display module together with the expanded area of the first housing.

17. The electronic device of claim 16, wherein
the first housing comprises a bracket moveable along the expansion direction,
the coupling unit comprises a coupling groove which is provided in the main body, adjacent to the mounting surface and has a shape corresponding to a shape of the bracket, and
the accessory device which is attached to the housing and the display module which are expanded disposes the bracket moved along the expansion direction, into the coupling groove and facing the mounting surface.

18. The electronic device of claim 16,
wherein the coupling unit comprises:
a first coupling unit provided at one end of the main body which is close to the housing, and
a second coupling unit provided at the other end of the main body which is opposite to the one end, and
wherein the accessory device which is attached to the electronic device and the display module which are expanded disposes:
the first coupling unit coupled to the housing at the second housing, and the second coupling unit coupled to the housing at the expanded area of the first housing.

19. The electronic device of claim 16, wherein the accessory device further comprises a connecting unit configured to electrically connect the electronic device to the accessory device.

20. The electronic device of claim 16, wherein the main body comprises:
   a first body detachably attached to the housing, and
   a second body moveable along the expansion direction and the retraction direction, relative to the first body.

* * * * *